(12) United States Patent
Suzuki

(10) Patent No.: US 6,469,290 B1
(45) Date of Patent: Oct. 22, 2002

(54) SOLID-STATE IMAGE PICKUP APPARATUS IN COMPLIANCE WITH THE ARRANGEMENT OF COMPLEMENTARY COLOR FILTER SEGMENTS AND A SIGNAL PROCESSING METHOD THEREFOR

(75) Inventor: Nobuo Suzuki, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 5 days.

(21) Appl. No.: 09/820,792

(22) Filed: Mar. 30, 2001

(30) Foreign Application Priority Data

Mar. 31, 2000 (JP) ........................................ 2000-101226

(51) Int. Cl.[7] .............................................. H01L 27/00
(52) U.S. Cl. ..................... 250/208.1; 250/226; 348/273
(58) Field of Search ............................. 250/208.1, 226, 250/214 DC, 214 R; 348/273, 272, 234, 276–279, 294, 342, 489; 396/307, 30, 34, 429; 382/162, 164, 167, 260

(56) References Cited

U.S. PATENT DOCUMENTS

| | | | |
|---|---|---|---|
| 4,758,883 A | * | 7/1988 | Kawahara et al. ........... 348/222 |
| 5,528,292 A | * | 6/1996 | Ikeda .......................... 348/222 |
| 5,862,425 A | * | 1/1999 | Aoki ........................... 396/429 |
| 5,907,355 A | * | 5/1999 | Kotaki ........................ 348/273 |
| 6,317,156 B1 | * | 11/2001 | Nagasaki et al. ........... 348/373 |

FOREIGN PATENT DOCUMENTS

| | | |
|---|---|---|
| JP | 58-31688 | 2/1983 |
| JP | 4-8992 | 2/1992 |
| JP | 8-340455 | 12/1996 |

OTHER PUBLICATIONS

Masafumi Inuiya, "Image Pickup Characteristics in Mega-pixels DS Camera", The Society of Photographic Science and Technology of Japan, Digital Camera Group, 1998.

* cited by examiner

Primary Examiner—Kevin Pyo
Assistant Examiner—Seung C. Sohn
(74) Attorney, Agent, or Firm—Arent Fox Kintner Plotkin & Kahn

(57) ABSTRACT

A solid-state image pickup apparatus includes photosensitive cells and color filter segments arranged in a particular pattern and assigned to a particular photosensitive cell each. Signal charges generated in the photosensitive cells by photoelectric transduction are digitized and then written to a frame memory as pixel data. Correlation of the pixel data read out of the frame memory is detected. Each color is multiplied by a particular constant on the basis of the detected correlation of the pixel data to thereby output corrected pixel data. The corrected pixel data are used to generate high-frequency luminance data and three primary color data for actual pixels and virtual pixels. The various kinds of data are used to generate a luminance signal and chrominance signals.

24 Claims, 17 Drawing Sheets

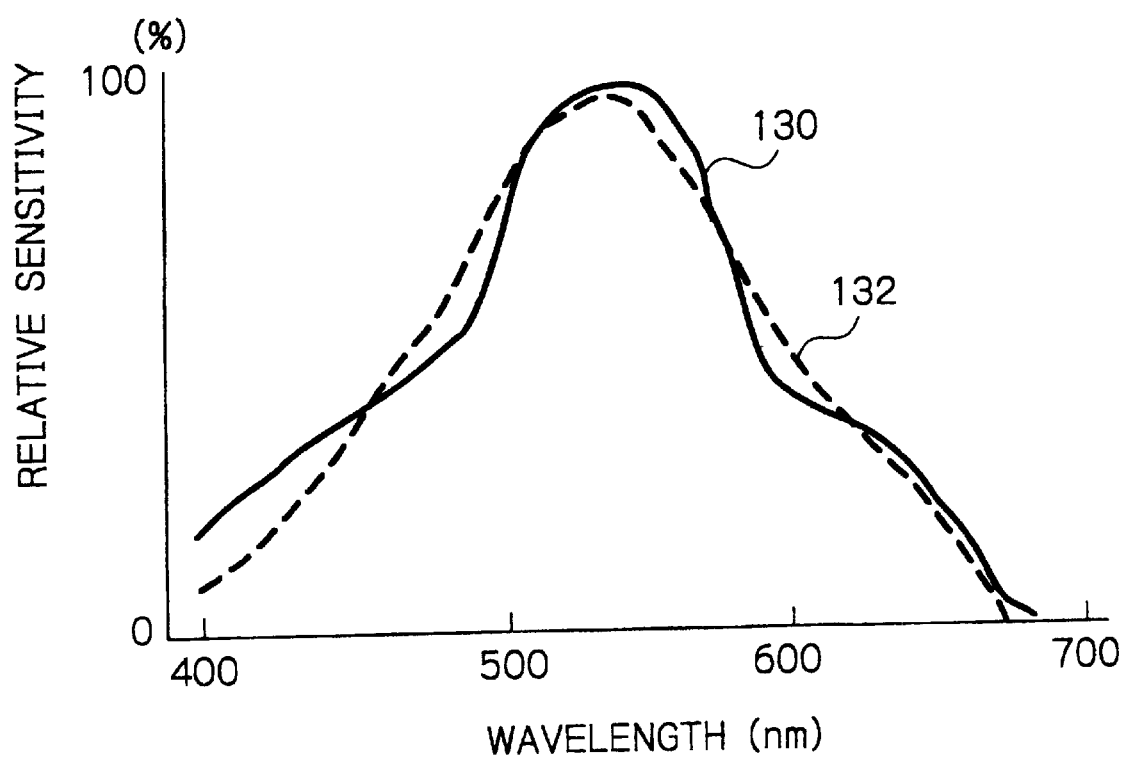

SOLID-STATE IMAGE PICKUP APPARATUS IN COMPLIANCE WITH THE ARRANGEMENT OF COMPLEMENTARY COLOR FILTER SEGMENTS AND A SIGNAL PROCESSING METHOD THEREFOR

BACKGROUND OF THE INVENTION

1. Field of the Invention

The present invention relates to a solid-state image pickup apparatus and a signal processing method therefor. This invention is advantageously applicable to, e.g., a digital camera, an image input unit or an image processing unit. The image pickup apparatus includes an image sensor constituting an input device and advantageously implemented as the image capturing section of, e.g., a digital camera, an image input unit or an image processing unit. Signals or images are processed, taking account of an arrangement of color filter segments of a color filter. This processing is, for example, desirably practicable with the image pickup apparatus.

2. Description of the Background Art

An interlacing type of solid-state image pickup apparatus is known in the art that includes a sensor array arranged in a honeycomb pattern. Specifically, the sensor array has photosensitive cells or photoelectric transducers (pixels) arranged bidimensionally. Nearby photosensitive cells are shifted from each other by one-half of a pixel pitch in the horizontal and vertical directions. More specifically, pixels on odd-numbered rows and pixels on even-numbered rows are shifted from each other by half a pitch in the direction of rows. Likewise, pixels on odd-numbered columns and pixels on even-numbered columns are shifted from each other by half a pitch in the direction of columns. The individual pixel has a tetragonal, hexagonal, octagonal or similar polygonal shape.

Vertical transfer paths extend zigzag in such a manner as to skirt round the pixels. Signal charges generated in the photosensitive cells are vertically transferred by, e.g., four-phase drive. The signal charges are then transferred to a horizontal transfer path via the vertical transfer paths and transferred along the horizontal path by, e.g., two-phase drive.

A color filter has color filter segments arranged in a pattern in front of the photosensitive cells in one-to-one correspondence. For example, the color filter segments are arranged in an R (red), G (green), B (blue) Bayer pattern inclined by 45 degrees.

The photosensitive cells having the above configuration directly output color signals of three primary colors R, G and B. Such color signals have a desirable S/N (Signal-to-Noise) ratio and high color reproducibility. The primary color filter, however, transmits only about one-third of wavelength components contained in incident white light, failing to efficiently use incident light. This limits the sensitivity and resolution of the resulting image.

To improve resolution, it has been customary to interpolate luminance data by using correlation of pixel data in the direction of rows and the direction of columns. Also, for the efficient use of incident light, it is a common practice to use color filter segments of complementary colors. Complementary color filter segments can use incident light with efficiency about two times as high as the efficiency available with the primary color filter segments.

The complementary color filter segments, however, bring about the following problem as to the interpolation of luminance data. Let luminance data calculated by interpolation using correlation and containing high frequency components be referred to as high-frequency luminance data. Even if the colors of a subject to be picked up do not change, the color components of the high-frequency luminance data are rendered differently when transformed to the primary colors R, G and B, depending on the position of calculation. As a result, noise appears in an image in the form of a stripe in the direction in which correlation exists. To reduce this kind of noise, the high-frequency luminance data are subjected to low-pass filtering in the direction in which correlation exists. Low-pass filtering, however, cancels the improvement in resolution.

SUMMARY OF THE INVENTION

It is an object of the present invention to provide a solid-state image pickup apparatus realizing both of high sensitivity and high resolution, and a signal processing method therefor.

In accordance with the present invention, a solid-state image pickup apparatus separates the colors of incident light at positions corresponding to the apertures of shield members, which shield the incident light. The color-separated light is transformed to a corresponding signal. The signal is processed to broaden its frequency band. The apparatus includes a solid-state image sensor including a color filter, a sensor array, and a reading circuit. The color filter has color filter segments, which include complementary color filter segments as to a spectral characteristic, for separating the incident light input via the apertures into a plurality of colors each having a particular spectral characteristic. The sensor array has photosensitive cells each for transforming the incident light input via a particular color filter segment to a signal charge. Nearby photosensitive cells are shifted from each other in at least one of the vertical and horizontal directions. The reading circuit sequentially reads out signal charges generated in the photosensitive cells in a preselected order to thereby produce an output signal.

A digitizing circuit digitizes the output signal for thereby outputting pixel data. Assuming actual pixels derived from positions where the photosensitive cells are present and virtual pixels intervening between the actual pixels, a signal processing circuit detects a correlation of the pixel data in the horizontal and/or the vertical direction. The signal processing circuit then multiplies each of the pixel data by a particular constant in accordance with the color of the color filter segment to thereby generate corrected pixel data. Subsequently, the signal processing circuit produces, based on the detected correlation, high-frequency luminance data including high-frequency components for the actual pixels and virtual pixels while producing, based on the pixel data, three primary color data. The signal processing circuit generates, based on such various kinds of pixel data, data relating to luminance and chrominance.

The color filter includes a first group of color filter segments of a first and a second color positioned on the same row and a second group of color filter segments of a third and a fourth color positioned on the same row. The first group of color filter segments and second group of filter segments, which adjoin each other, are shifted from each other by one-half of a pixel pitch. The color filter segments are arranged such that a first sum of products and a second sum of products, which are respectively produced by multiplying the spectral characteristic of the first group by a first and a second constant and multiplying the spectral characteristic of the second group by a third and a fourth constant, are substantially equal to each other, and such that the first and second sums have a relation close to a spectral characteristic representative of luminance.

Also, in accordance with the present invention, a signal processing method begins with a step of separating colors of light incident to a solid-state image sensor having a first group of color filter segments of a first and a second color positioned on the same line and a second group of color filter segments of a third and a fourth color positioned on the same line. The first group of color filter segments and second group of filter segments, which adjoin each other, are shifted from each other by one-half of a pixel pitch, and each corresponds to the aperture of a particular shield members that shield incident light.

Photosensitive cells, each of which adjoins a particular color filter segment, transforms the color-separated light to corresponding signal charges. The signal charges are read out in the form of an analog signal and then processed. The processed analog signal is converted to a digital signal. The digital signal are written, in the form of pixel data, in a memory from which the pixel data can be repeatedly read out a plurality of times. Correlation in at least one of the horizontal and vertical directions is detected by using the pixel data read out of the memory. Each of the pixel data is multiplied by a particular preselected constant assigned to a particular color to thereby generate corrected pixel data. Calculation, which gives consideration to the direction of the correlation detected, is executed with the corrected pixel data to thereby generate high-frequency luminance data containing high-frequency components. Three primary color data are generated by using the pixel data read out of the memory. Luminance data and chrominance data are produced by using the high-frequency luminance data and the three primary color data.

More specifically, signals derived from the photosensitive cells of the first color and the signals derived from the photosensitive cells of the second color are multiplied by a first and a second constant, respectively. The resulting products are added to produce a first sum. Signals derived from the photosensitive cells of the third color and the signals derived from the photosensitive cells of the fourth color are multiplied by a third and a fourth constant, respectively. The resulting products are also added to produce a second sum. The first to fourth constants are selected such that the first and said second sums have a relation close to a spectral characteristic representative of luminance.

BRIEF DESCRIPTION OF THE DRAWINGS

The objects and features of the present invention will become more apparent from consideration of the following detailed description taken in conjunction with the accompanying drawings in which:

FIG. 10 is a graph showing curves representative of spectral characteristics respectively particular to the combination of green multiplied by 2 and magenta and the combination of yellow and cyan in any one of the patterns of FIGS. 9A and 9B;

DESCRIPTION OF THE PREFERRED EMBODIMENTS

Figure 1:
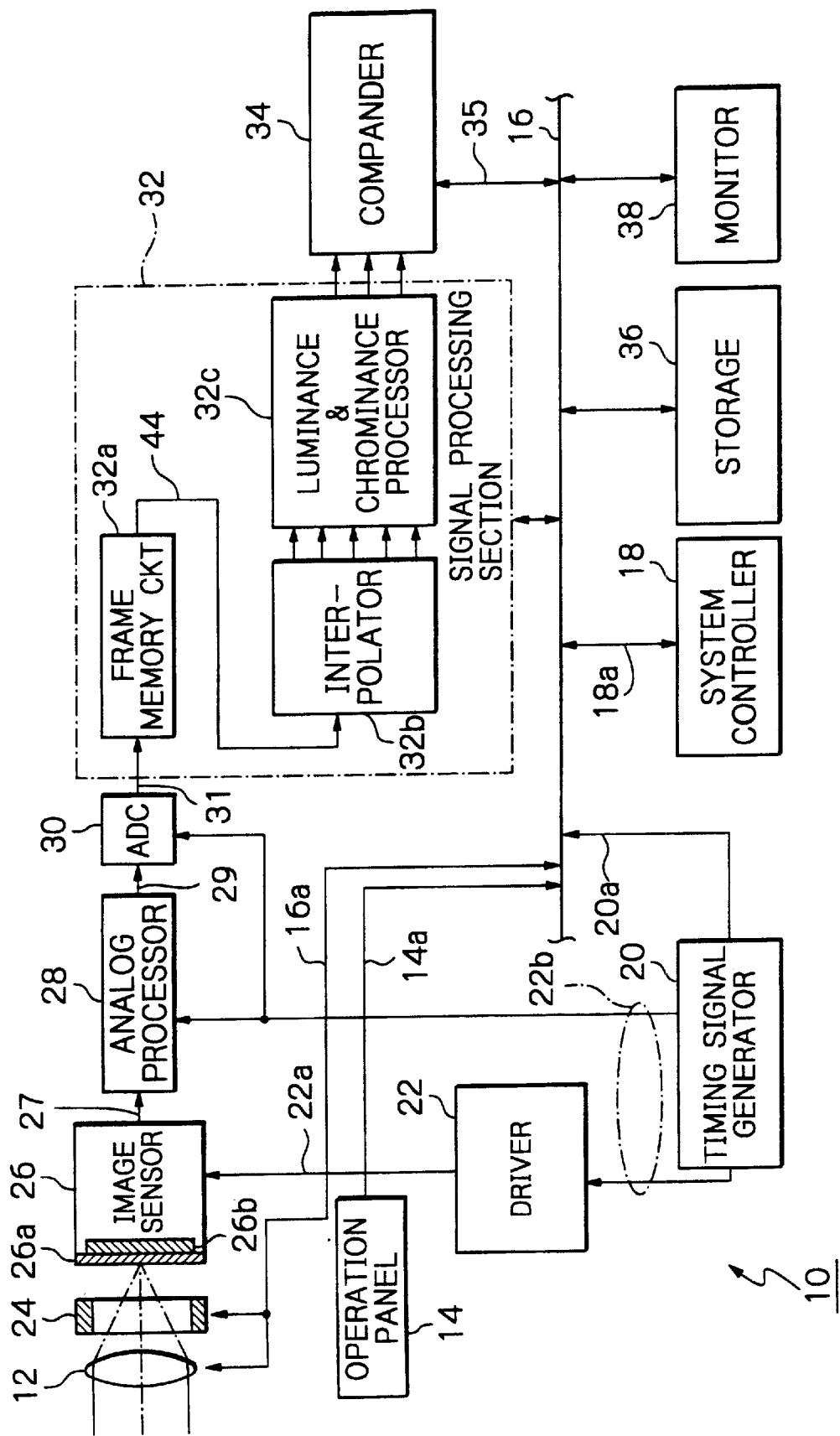
FIG. 1 is a schematic block diagram showing a digital still camera to which a preferred embodiment of the solid-state image pickup apparatus in accordance with the present invention is applied.

Referring to FIG. 1 of the drawings, a digital still camera to which a solid-state image pickup apparatus embodying the present invention is applied is shown and generally designated by the reference numeral 10. In FIG. 1, part of the camera 10 not relevant to the understanding of the present invention is not shown. Signals are designated by reference numerals attached to signal lines on which they appear.

As shown in FIG. 1, the camera 10 includes an optical lens system 12, an operation panel 14, a system controller 18, a timing signal generator 20, a driver 22, a mechanical shutter 24, and a solid-state image sensor 26. The camera 10 further includes an analog processor 28, an ADC (Analog-to-Digital Converter) 30, a signal processing section 32, a compander 34, a storage 36, and a monitor 38.

The lens system 12 is representative of, e.g., a plurality of optical lenses, although not shown specifically. The lens system 12 additionally includes a zoom mechanism and an AF (Automatic Focus) control mechanism not shown. The zoom mechanism adjusts the position of the lens system 12 in accordance with a signal 14a output from the operation panel 14, thereby adjusting a view angle. The AF control mechanism controls focus in accordance with a distance between the camera 10 and a subject to be picked up. More specifically, the signal 14a is delivered from the operation panel 14 to the system controller 18 over a system bus 16. The system controller 1–8 feeds a control signal 18a to the lens system 12 over a signal line.

The operation panel 14 includes a shutter release button, not shown, and a cursor moving function that allows the operator of the camera 10 to select items being displayed on the monitor 38 by using, e.g., direction keys. The operator's manipulation of the operation panel 14 is reported to the system controller 18 over a signal line 14a.

The system controller 18 includes a CPU (Central Processing Unit) by way of example and a ROM (Read Only Memory) although not shown specifically. The ROM stores a program describing the operation procedure of the camera 10. By using the information 14a received from the operation panel 14 and the information stored in the ROM, the system controller 18 generates control signals 18a for controlling the operations of the various sections of the camera 10. Specifically, the system controller 18 feeds the control signals 18a to the timing signal generator 20, lens system 12, mechanical shutter 24, signal processing section 32, compander 34, storage 36 and monitor 38 over the system bus 16.

The timing signal generator 20 includes an oscillator, not shown, for generating a system clock 20a. The system clock 20a is fed to most of the blocks of the camera 10 that need it, e.g., the system controller 18 and signal processing section 32, although not shown specifically. Further, the timing signal generator 20 includes a circuit for generating, based on the control signals 18a, timing signals 20b that cause the various sections to operate. The timing signals 20b are input to the driver 22 as well as to other various sections. The driver 22 delivers necessary drive pulses 22a to the image sensor 26.

The mechanical shutter 24 operates in accordance with the control signal 18a output from the system controller 18 on the basis of the position of the shutter release button of the operation panel 14.

The image sensor 26 is a single, color CCD (Charge Coupled Device) image sensor configured integrally with a color filter 26a. The image sensor 26 includes photosensitive cells arranged in a sensor array 26b. The image sensor 26 outputs a signal 27 corresponding to the quantity of light that is incident to the individual photosensitive cells. The image sensor 26 will be described more specifically later. For the image sensor 26, use may be made of a MOS type image sensor to be described later, if desired.

In the image sensor 26, signal charges are generated by photoelectric transduction and then output to vertical transfer paths in accordance with the drive signals 22a by field shift. This is effected at a preselected timing, e.g., during vertical blanking period. The signal charges are then shifted to a horizontal transfer path by line shift. An output circuit, not shown, is connected to the horizontal transfer path for transforming the signal charges to the analog voltage signal 27 by charge-to-voltage conversion. The analog voltage signal 27 is input to the analog processor 28. When the photosensitive cells are implemented by CCDs, the image sensor 26 selectively uses a pixel-mixed thin-out type of reading system or an all pixel reading system in accordance with a signal charge reading mode. Such signal reading systems will be described more specifically later.

The analog processor 28 removes noise components from the signal 27 and delivers the resulting noise-free analog signal 29 to the ADC 30. The ADC 30 quantizes the levels of the input signals 29 by using a preselected reference level to thereby convert the signal 29 to digital image data 31. The image data 31 are input to the signal processing section 32 in accordance with the timing signal 20b, which is output from the timing signal generator 20 and includes a conversion clock.

Figure 2:
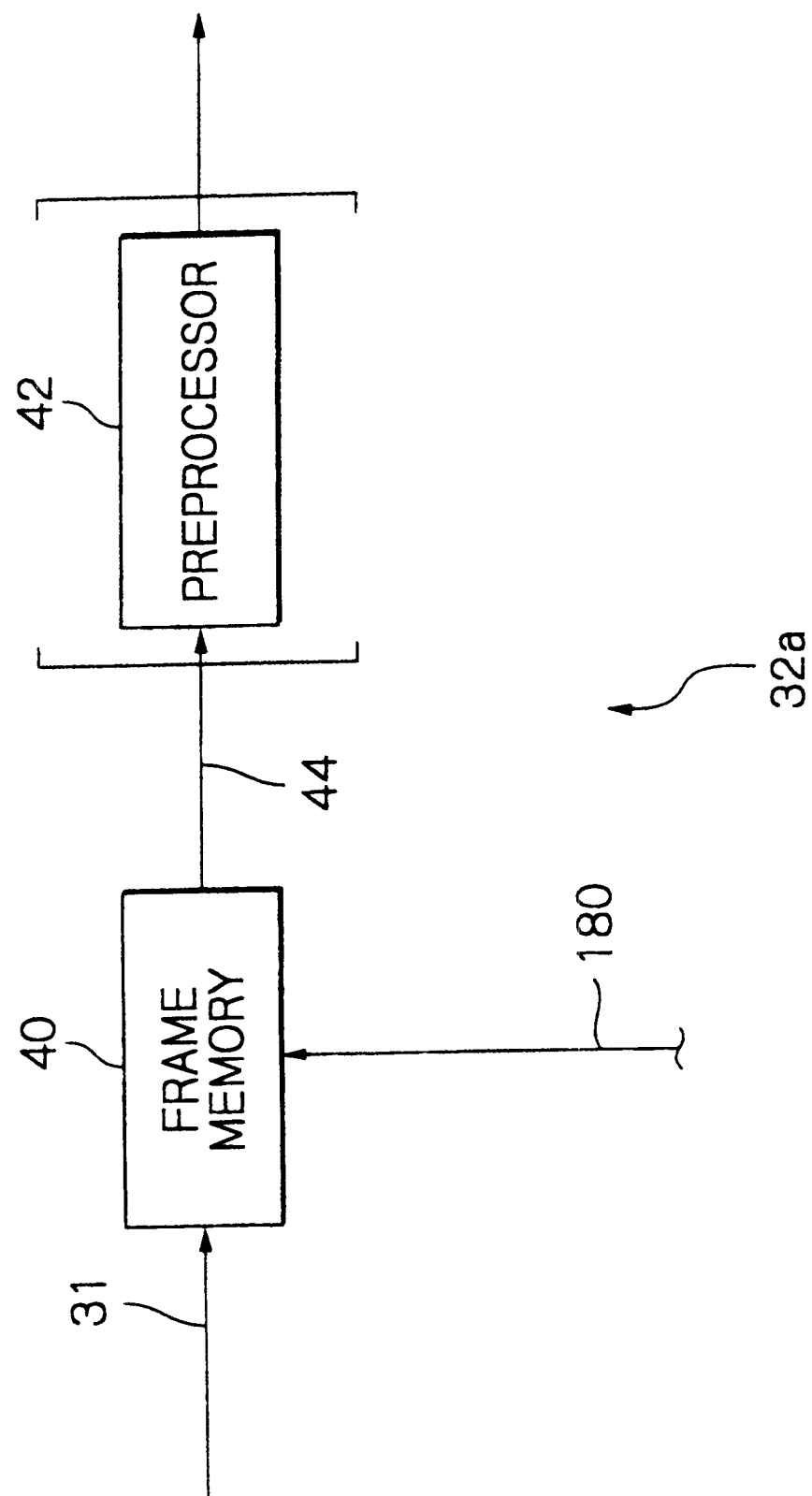
FIG. 2 is a schematic block diagram showing a specific configuration of a frame memory circuit shown in FIG. 1.

The signal processing section 32 includes a frame memory circuit 32a, an interpolator 32b, and a luminance and chrominance signal processor 32c. As shown in FIG. 2, the frame memory circuit 32a is made up of a frame memory 40 and a preprocessor 42. The image data 31 output from the ADC 30 are written to the frame memory 40. The image data 31 are repeatedly read out of the region of the frame memory 40 that is sequentially shifted. In this respect, the frame memory 40 should preferably be implemented by a nondestructive memory. The system controller 18 delivers to the frame memory 40 a control signal 180 (control signal 18a) including a write/read enable signal, a clock signal and other signals necessary for control.

The frame memory 32a may directly output the stored image data in a preselected order as image data 44. The image data read out of the frame memory 32a may be routed through the preprocessor 42 and output as the image data 44, as needed. The preprocessor 42 performs, e.g., color-by-color gain adjustment in order to match the levels of image data, each of which is derived from a particular color filter segment, to the following signal processing circuitry. In addition, the preprocessor 42 performs gamma correction for reducing the number of bits to be dealt with, thereby saving power and scaling down the circuitry.

Figure 3:
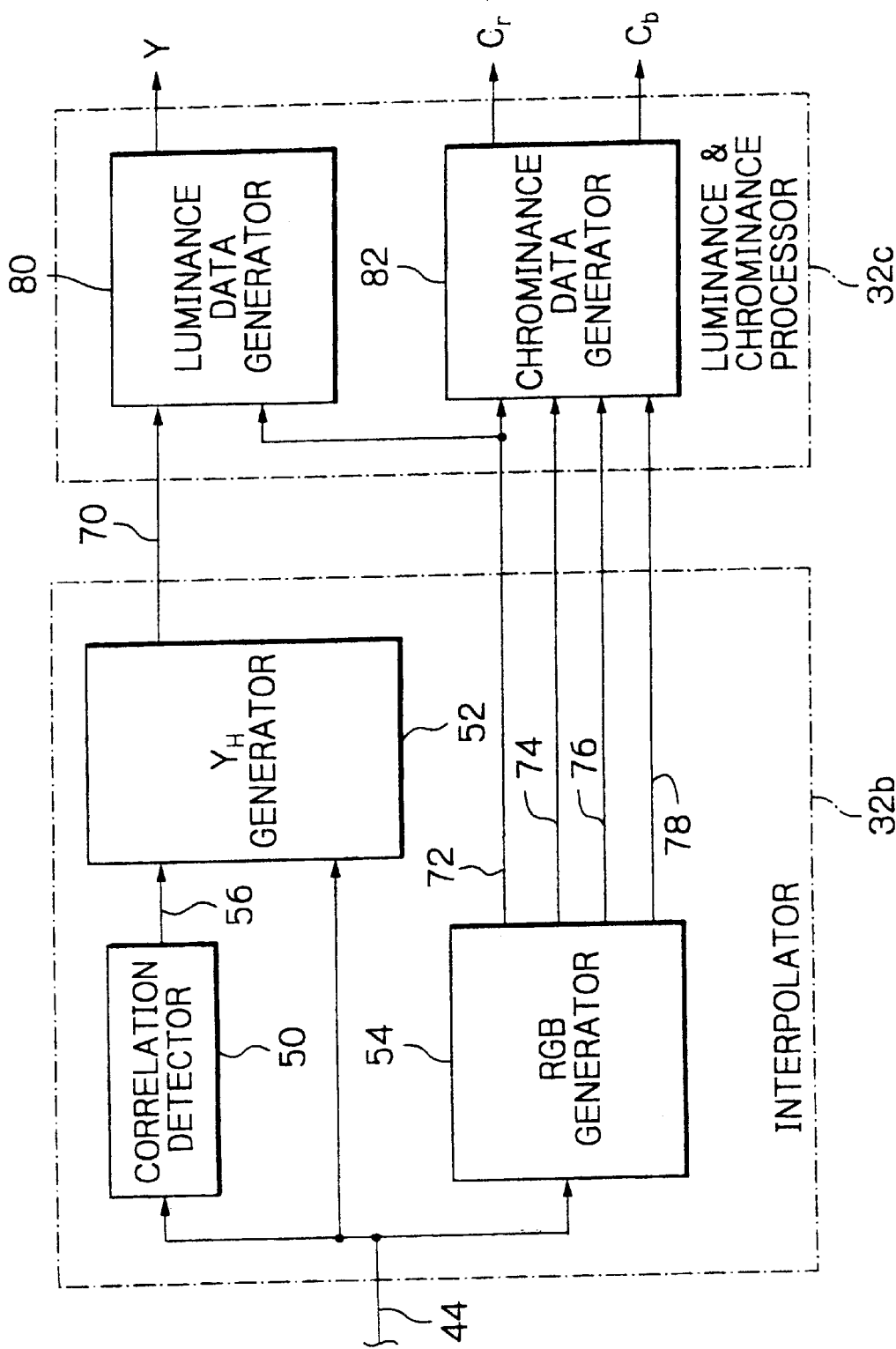
FIG. 3 is a schematic block diagram showing specific configurations of an interpolator and a luminance and chrominance signal processor shown in FIG. 1.

The pixel data derived from the photosensitive cells and including complementary colors are input to the interpolator 32b. In the illustrative embodiment, the interpolator 32b interpolates, based on the pixel data, high-frequency luminance data $Y_H$, which contain high frequency components, and primary color data in the actual pixels where the photosensitive cells are present and virtual pixels intervening between the actual pixels. As shown in FIG. 3 specifically, the interpolator 32b is made up of a correlation detector 50, a $Y_H$ generator 52, and an RGB generator 54.

The correlation detector 50 determines whether or not correlation exists and determines, if correlation exists, the direction of correlation, i.e., horizontal or vertical. The correlation detector 50 detects correlation with a procedure to be described later and feeds the result of detection to the $Y_H$ generator 52.

Figure 4:
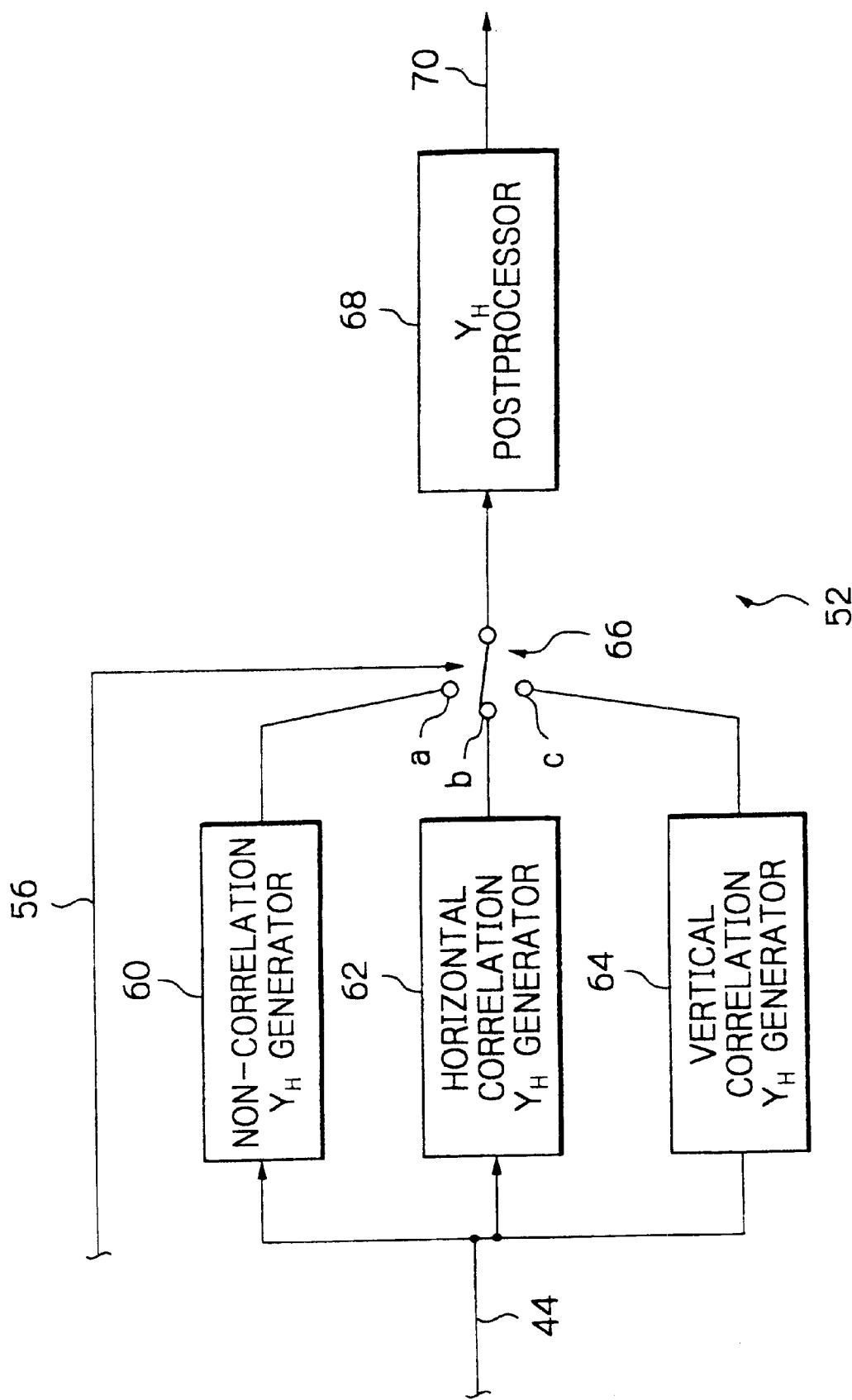
FIG. 4 is a schematic block diagram showing a specific configuration of a $Y_H$ generator shown in FIG. 3.

As shown in FIG. 4, the $Y_H$ generator 52 includes a non-correlation $Y_H$ generator 60, a horizontal correlation $Y_H$ generator 62 and a vertical correlation $Y_H$ generator 64 each generating, based on the input pixel data, high-frequency luminance data $Y_H$ for the actual pixels or the virtual pixels. Specifically, in the illustrative embodiment, the Y, generators 60, 62 and 64 respectively generate high-frequency luminance data $Y_H$ when correlation does not exist, when it exists in the horizontal direction, and when it exists in the vertical direction. The high-frequency luminance data $Y_H$ output from the $Y_H$ generators 60, 62 and 64 are respectively fed to terminals a, b and c included in a $Y_H$ switch or selector 66.

The correlation detector 50 delivers a correlation signal 56 to the $Y_H$ switch 66. The $Y_H$ switch selects one of the terminals a, b and c, i.e., the high-frequency luminance data $Y_H$ in accordance with the correlation signal 56. The luminance data $Y_H$ selected by the $Y_H$ switch 66 is input to a $Y_H$ postprocessor 68.

The $Y_H$ postprocessor 68 combines the high-frequency luminance data $Y_H$ selected by the $Y_H$ switch 66. In addition, the Y, postprocessor 68 executes, e.g., edge enhancement with the luminance data $Y_H$ with a low-pass filter or a high-pass filter to thereby enhance image quality. Processed $Y_H$ data 70 output from the $Y_H$ postprocessor 68 are delivered to a luminance data generator 80 (see FIG. 3) included in the luminance and chrominance signal processor 32c.

Referring again to FIG. 3, the RGB generator 54 produces R data 74, G data 76 and B data 78 for the virtual pixels and actual pixels from the pixel data, which include complementary colors. Further, the RGB generator 54 generates low-frequency luminance data $Y_L$ 72 including low-frequency components. In addition, the RGB generator 54 executes white balance adjustment and gamma correction. The R data 74, G data 76, B data 78 and low-frequency luminance data $Y_L$ 72 are input to a chrominance data generator 82 included in the luminance and chrominance signal generator 32c. In the illustrative embodiment, the RGB generator 54 generates, based on the pixel data of the actual pixels, primary color pixel data for the virtual pixels and then generates, based on the primary color pixel data, primary color data for the actual pixels.

Figure 5:
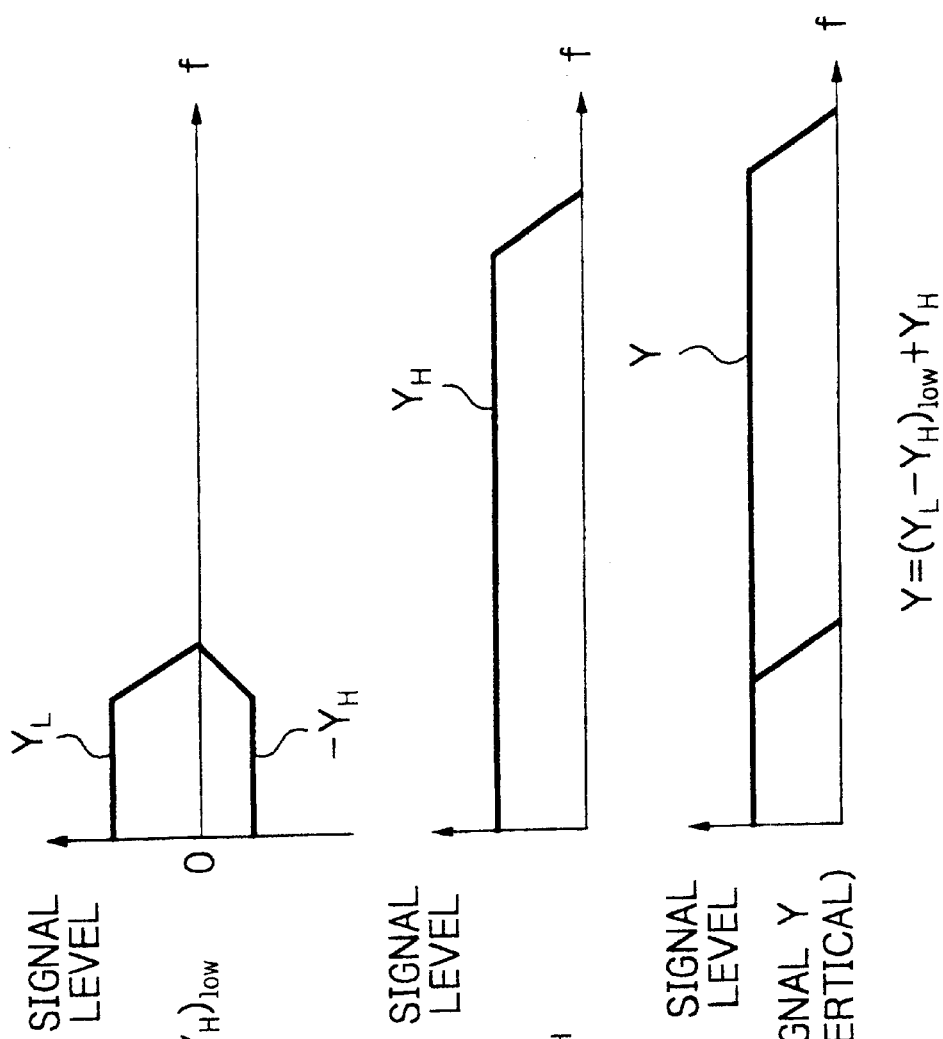
FIGS. 5A through 5C are graphs showing frequency allocation useful for understanding the band broadening function of a luminance data generator shown in FIG. 3.

In the luminance and chrominance signal processor 32c, the luminance data generator 80 performs quasi-addition with the frequencies of the high-frequency luminance data $Y_H$ 70 and low-frequency luminance data $Y_L$ 72 to thereby output broadband luminance data $Y$ ($Y_h \cdot Y_{low}$ method). More specifically, the luminance data generator 80 subtracts the high-frequency luminance data $Y_H$ from the low-frequency luminance data $Y_L$ by the $y_h \cdot Y_{low}$ method and executes low-pass filtering with the remainder, thereby producing a signal $(Y_L - Y_H)_{low}$ (see FIG. 5A). The generator 80 then adds the high-frequency luminance data $Y_H$ (see FIG. 5B) to the signal $(Y_L - Y_H)_{low}$ to thereby produce a signal $(Y_L - Y_H)_{low} + Y_H$ (see FIG. 5C) broadened in frequency band. This broadband signal is input to the compander 34 as luminance data Y.

It is to be noted that the $Y_H$ generator 52 may feed the high-frequency luminance data $Y_H$ 70 to the chrominance data generator 82, although not shown specifically.

The chrominance data generator 82 generates two different chrominance data (R–Y) and (B–Y) or $C_r$ and $C_b$ on the basis of the low-frequency luminance data $Y_L$ 72. The generator 82 will use the high-frequency luminance data $Y_H$ when the data $Y_H$ is fed thereto, as mentioned above. Chrominance data $C_r$ and $C_b$ output from the generator 82 are input to the compander 34, FIG. 1.

The compander 34 includes a frame memory, a compressing circuit, and an expanding circuit, although not shown specifically. The frame memory temporarily stores one frame of luminance data and chrominance data fed from the luminance and chrominance signal processor 32c. The compressing circuit compresses an image by use of, e.g., JPEG (Joint Photographic Experts Group) standards using orthogonal transform. The expanding circuit expands the compressed image to thereby restore original data. The frame memory may be implemented by the frame memory circuit 32a of the signal processing section 32, if desired.

In a record mode, the compander 34 delivers compressed data to the storage 36 on the system bus 16 under the control of the system controller 18. The compander 34 is capable of simply passing the data fed from the RGB generator 54, FIG. 3, therethrough to the system bus 16 under the control of the system controller 18. Also, the compander 34 is capable of transferring the signals fed from the luminance and chrominance signal processor 32c to the monitor 38 on the system bus 16 under the control of the system controller 18.

In a reproduction mode, the compander 34 expands data read out of the storage 36 and input thereto over the system bus 16. The expanded data are written to the frame memory. Subsequently, the data are read out of the frame memory in a predetermined sequence under the control of the system controller 18 and displayed on the monitor 38.

The storage 36 includes a recording circuit for writing image data in a recording medium and a reproducing circuit for reading them out of the recording medium, although not shown specifically. The recording medium may be implemented by a Smart Media (trade name) or similar semiconductor memory, a magnetic disk or an optical disk by way of example. When use is made of a magnetic disk or an optical disk, the storage 36 will additionally include a head for writing image data in the disk. The monitor 38 displays the luminance data and chrominance data or the R, G and B data received over the system bus 16 under the control of the system controller 18. At this instant, the system controller 16 takes account of the screen size of the monitor 38 and adjusts the display timing.

The foregoing description has concentrated on a procedure for shooting a scene as a still picture. Alternatively, before the operator pushes the shutter release button, a scene being picked up may be displayed on the monitor 38 as a movie without the intermediary of the compander 34 (movie mode). However, when it comes to an image sensor having more than one million pixels, the movie mode needs a long processing time and results in a time-lapse movie, which is critical as to image quality. In such a case, signal charges may be read out of only part of the photosensitive cells (thinning out). Digital pixel data derived from such signal charges will be processed by an exclusive movie processing section, not shown, independently of a still picture and displayed on the monitor 38.

Figure 6:
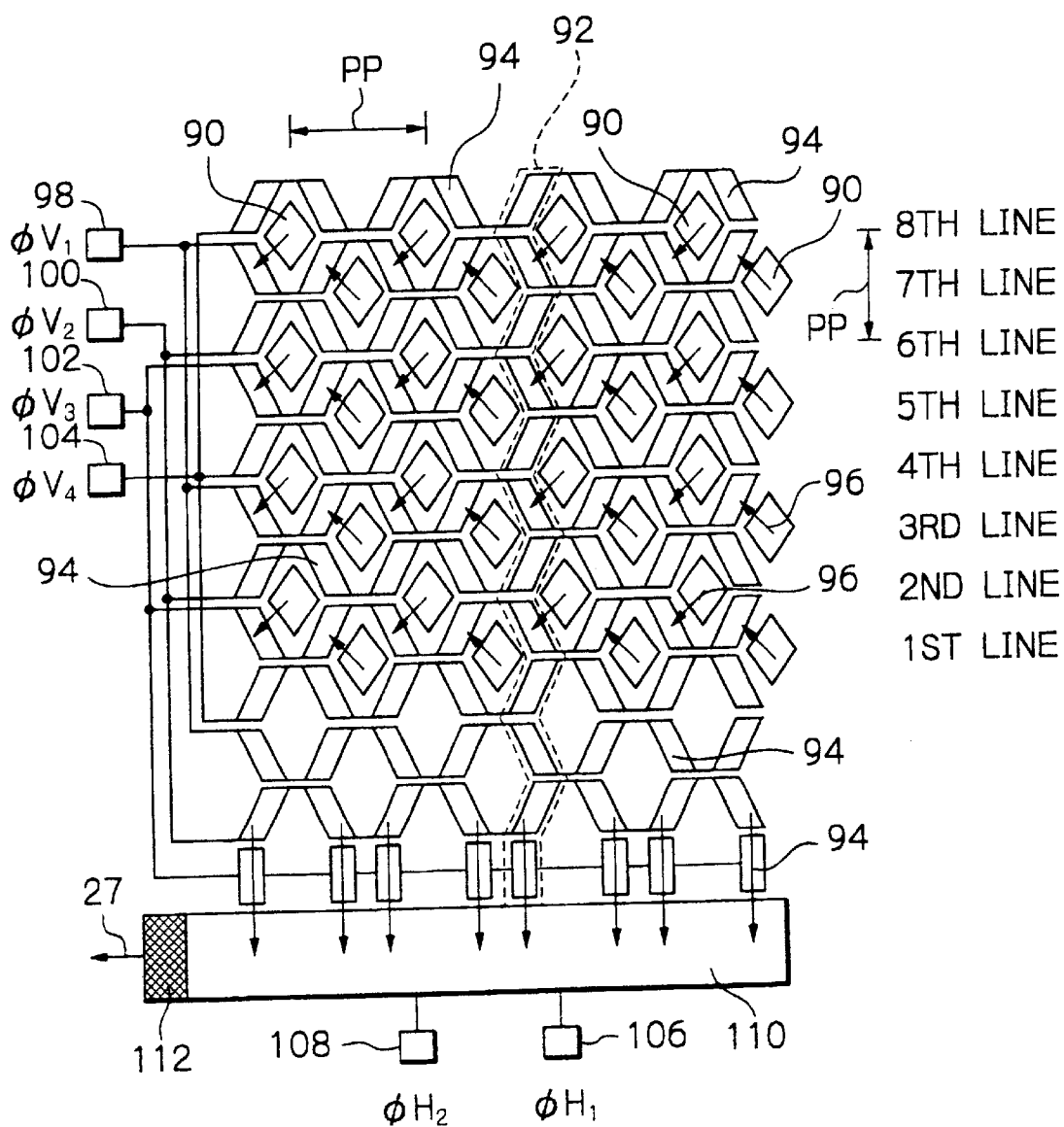
FIG. 6 is a view showing the general configuration of photosensitive cells, as seen from the light incidence side, included in a solid-state image sensor shown in FIG. 1.

To better understand the operation of the camera 10, the configuration of the image sensor 26 will be described specifically hereinafter. As shown in FIG. 6, assume that the image sensor 26 is of interlacing type and has pixels arranged in rows and columns at a pitch or distance of PP. Then, nearby photosensitive cells 90 are shifted from each other by one-half of the pixel pitch PP in the horizontal and vertical directions. While the individual photosensitive cell 90 is shown as having a rhombic aperture, it may have a tetragonal, hexagonal, octagonal or similar polygonal shape. The color filter segments assigned one-to-one to the photosensitive cells 90 may also be polygonal, e.g., tetragonal, hexagonal or octagonal.

Vertical CCD registers 92 each has a plurality of transfer electrodes 94, as indicated by a phantom line in FIG. 6. The transfer electrodes 94 of nearby vertical CCD registers 92 are so arranged as to surround the photosensitive cells 90 complementarily to the shape of the individual cell 90. Transfer gates, not shown, are formed integrally with the transfer electrodes 94 between the photosensitive cells 90, which are indicated by arrows 96, and the vertical CCD registers 92. When the individual transfer gate is closed, it confines a signal charge generated in the adjoining photosensitive cell 90 by photoelectric transduction in the cell 90. The transfer gate is opened at a preselected timing for a preselected period of time, so that the signal charge is read out of the photosensitive cell 90 to the adjoining vertical register 92.

The image sensor 26 further includes four electrode terminals 98, 100, 102 and 104. Vertical drive signals $\phi V_1$, $\phi V_2$, $\phi V_3$ and $\phi V_4$ are applied to the electrode terminals 98, 100, 102 and 104, respectively. On the other hand, horizontal drive signals $\phi H_1$ and $\phi H_2$ are applied to electrode terminals 106 and 108, respectively. The electrode terminals 98 through 104 each are connected to four transfer electrodes 94. It will therefore be seen that the vertical CCD registers 92 are driven by four-phase drive. The signal charges are transferred to a horizontal CCD register 110 over the vertical CCD registers 92.

On the other hand, the horizontal register 110 is driven by two-phase drive using the horizontal drive signals φH$_1$ and φH$_2$ input to the electrode terminals 106 and 108.

Specifically, assume that the photosensitive cells 90 positioned at the bottom of the bidimensional pattern constitute a first line, and that the line number sequentially increases toward the top photosensitive cells 90. Signal lines extend horizontally from the respective electrodes. During the vertical blanking period of the first field, the electrode terminals 98 and 100 and the electrode terminals 102 and 104 are brought to a low level and a high level, respectively. Subsequently, a transfer gate pulse V$_R$, not shown, higher than the above high level is applied to the electrode terminal 102. As a result, signal charges are read out of the photosensitive cells 90 on the first, second, fifth and sixth lines to the vertical CCD registers 92. On the elapse of the vertical blanking period, the signal charges are sequentially transferred toward the horizontal CCD register 110 via the vertical CCD registers 92 during horizontal blanking period.

During valid signal period, the signal charges on the first and second lines are horizontally transferred along the horizontal CCD register 110 in accordance with the horizontal drive signals φH$_1$ and φH$_2$ and output via an output section 112. In this manner, the signal charges on the first and second lines are output as pixel signals alternately with each other. Subsequently, the signal charges on the fifth and sixth lines are output in the same manner.

During the vertical blanking period of the second field, the electrode terminals 98 and 100 and the electrode terminals 102 and 104 are brought to a high level and a low level, respectively. Subsequently, a transfer gate pulse V$_R$, not shown, higher than the above high level is applied to the electrode terminal 98. As a result, signal charges on the third, fourth, seventh and eighth lines are read out to the vertical CCD registers 92. The signal charges are sequentially transferred along the vertical CCD registers 92 and horizontal CCD register 110 and output via the output section 112. More specifically, signal charges on the third and fourth lines are read out alternately with each other, and then signal charges on the seventh and eighth lines are read out alternately with each other. In this manner, the image sensor 26 is caused to output the signals 27 by interlace scanning.

To produce a single frame of image, two continuous fields of images are digitized and then stored in the frame memory. The mechanical shutter 24 may be used to prevent the exposure time from being shifted by one field between the consecutive fields. Specifically, the mechanical shutter 24 closes, for example, from the blanking period of the first field to the blanking period of the second field, shielding the photosensitive cells 90. This insures an image exposed at the same instant. In addition, by closing the mechanical shutter 24 after the blanking period of the first period, it is possible to reduce the smear of the output signals 27.

Paying attention to resolution, the image sensor 26 generally has either one of a tetragonal lattice configuration and a honeycomb configuration. The honeycomb configuration is equivalent to the tetragonal lattice configuration rotated by 45° and having the pixel pitch PP of N μm. While nearby pixels of the tetragonal lattice configuration are spaced by a distance of |PP|=N μm, nearby pixels of the honeycomb configuration are spaced by a distance of N×(2)$^{-1/2}$ that is shorter than the distance |PP|. Therefore, in the honeycomb configuration, pixels are arranged more densely than in the tetragonal lattice configuration and implements, in principle, (2)$^{1/2}$ times higher resolution in both of the horizontal and vertical directions.

When the honeycomb configuration is rearranged into the tetragonal lattice configuration matching with the output format, the signal processing section 32 interpolates virtual pixels on the basis of real pixels adjoining them. It will be seen that when pixels of colors and luminance not obtained are interpolated and rearranged while the above interpolation is under way, the resulting resolution is higher than when the photosensitive cells 90 are simply arranged in the tetragonal lattice configuration.

In the illustrative embodiment, the color filter 26a has complementary color filter segments, as stated earlier. Why complementary colors are used will be briefly described hereinafter. Today, the photosensitive area of the individual photosensitive cell is decreasing to implement an increasing demand for higher resolution, i.e., a greater number of pixels. This directly translates into the fall of sensitivity of the individual photosensitive cell and thereby introduces noise in the resulting image. If incident light can be efficiently used, then there can be maintained high image pickup sensitivity despite a small chip size. Efficient color separation is one of requisites for the efficient use of incident light. While a conventional primary color (R, G and B) filter features high color reproducibility, its sensitivity is limited.

Figure 7:
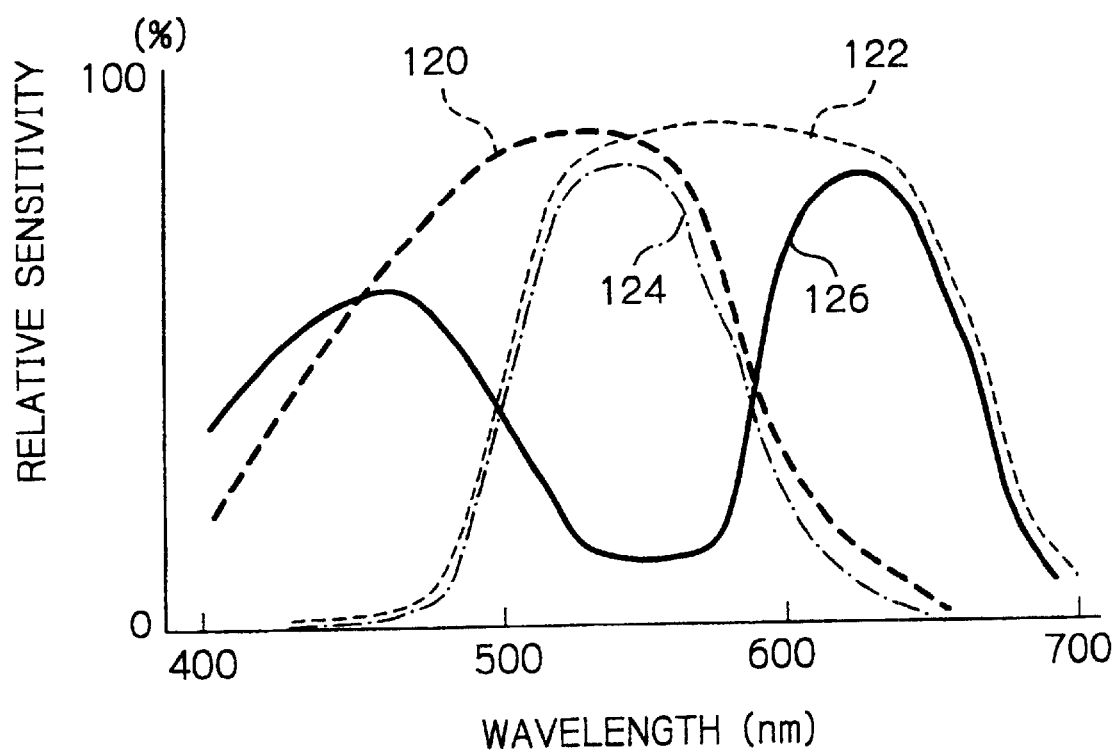
FIG. 7 is a graph showing curves representative of color-by-color spectral characteristics of color filter segments each being assigned one-to-one to the photosensitive cells of FIG. 6.

By contrast, a complementary color filter transmits about two times more light than a primary color filter, as well known in the art (see FIG. 7). In FIG. 7, a thick dashed curve 120 and a thin dashed curve 122 are representative of cyan (Cy) and yellow (Ye), respectively. Also, a dash-and-dot curve 124 and a solid curve 126 are representative of G and magenta (Mg), respectively. As shown, complementary color segments Cy, Ye and Mg each transmits incident light over a wavelength range substantially two times as broad as the range available with G filter segments despite substantially the same relative sensitivity. This proves that a complementary color filter can use incident light with efficiently substantially two times as high as the efficiency of a primary color filter.

Figure 8:
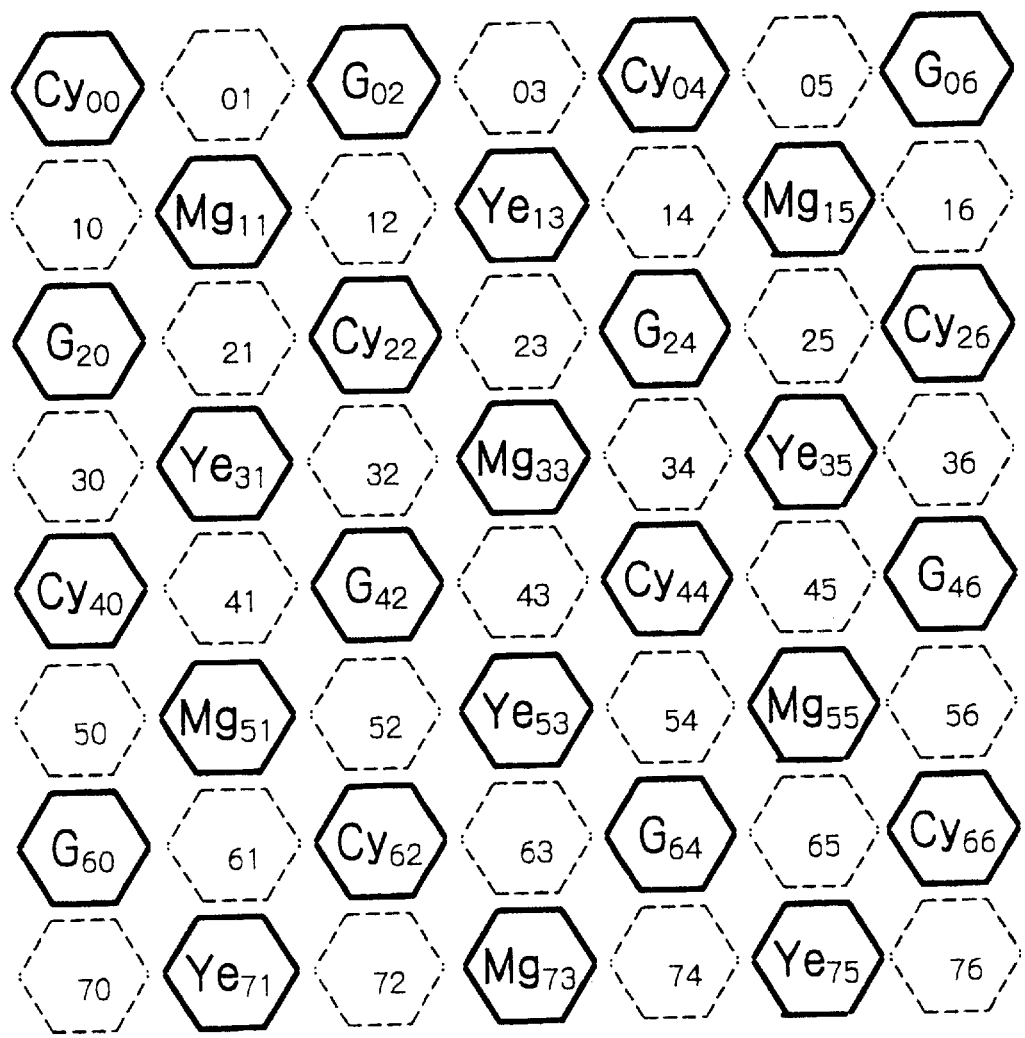
FIG. 8 is a view showing a specific pattern in which conventional color filter segments including complementary colors are arranged.

FIG. 8 shows a specific conventional pattern in which color filter segments are arranged in a tetragonal lattice type of solid-state image sensor. In FIG. 8, suffixes attached to G, Cy, Ye and Mg each are representative of a position in a matrix. Solid lines are representative of actual pixels where photosensitive cells exist. Phantom lines are representative of virtual pixels, where photosensitive cells do not exist, and interpolated on the basis of surrounding actual pixels.

Hereinafter will be described a procedure for generating high-frequency luminance data Y$_H$, which are interim data to derive final luminance data Y. When correlation does not exist, the luminance data Y$_H$ approximately corresponds to the sum of four surrounding pixels. To substantially equalize the contribution of the photosensitive cells throughout the pixels, a coefficient corresponding two times is assigned to signals derived from the photosensitive cells that correspond to G. As for the pattern shown in FIG. 8, high-frequency luminance data Y$_{H21}$ for a virtual pixel (2,1) is produced by:

$$Y_{H21}=(2G_{20}+Cy_{22}+Mg_{11}+Ye_{31})/2 \quad (1)$$

When correlation exists in the vertical direction or direction of columns, a sum of two pixel data vertically adjoining each other is interpolated as high-frequency luminance data Y$_H$. For example, assume that pixel data vertically adjoining the virtual pixel (2,1) and pixel data vertically adjoining a virtual pixel (1,2) have correlation each. Then, high-frequency luminance data Y$_{H21}$ and Y$_{H12}$ to be interpolated in the virtual pixels (2,1) and (1,2) are respectively expressed as:

$$Y_{H21} = Mg_{11} + Ye_{31} \quad (2a)$$

$$Y_{H12} = 2G_{02} + Cy_{22} \quad (2b)$$

Complementary colors may approximately be represented by primary colors as:

$$Cy = G + B \quad (3a)$$

$$Ye = R + G \quad (3b)$$

$$Mg = R + B \quad (3c)$$

Assume that a subject to be picked up sparingly changes in color, i.e., the individual primary color R, G or B. Then, paying attention to primary colors, the high-frequency luminance data $Y_{H21}$ and $Y_{H12}$ are respectively expressed as:

$$\begin{aligned} Y_{H12} &= (2G_{20} + Cy_{22} + Mg_{11} + Ye_{31})/2 \\ &= (2G + G + B + R + B + R + G)/2 \\ &= 2G + R + B \end{aligned} \quad (4a)$$

$$\begin{aligned} Y_{H21} &= Mg_{11} + Ye_{31} \\ &= R + B + R + G \\ &= G + 2R + B \end{aligned} \quad (4b)$$

$$\begin{aligned} Y_{H12} &= 2G_{02} + Cy_{22} \\ &= 2G + G + B \\ &= 3G + B \end{aligned} \quad (4c)$$

It will be seen that the sums of the equations (4b) and (4c) differ from each other despite that vertical correlation exists and that the positions are close to each other. This is also true with the high-frequency luminance data $Y_H$ calculated in the absence of correlation and in the presence of vertical correlation. Such differences indicate that the luminance data $Y_H$ interpolated in the virtual pixel on the basis of vertical correlation generates stripe-like noise in the direction of columns, degrading image quality. It has been customary to effect LPF (Low-Pass Filter) processing in the vertical direction in order to remove the noise. The LPF processing, however, cancels enhanced resolution achievable with the high-frequency luminance data $Y_H$, as discussed earlier. This problem also occurs when correlation processing is executed in the horizontal direction.

To obviate the stripe-like noise, in the illustrative embodiment, the color filter 26a is configured with consideration given to the arrangement of complementary color filter segments and the spectral characteristic of the individual color filter segment, as will be described hereinafter.

Figure 9A:
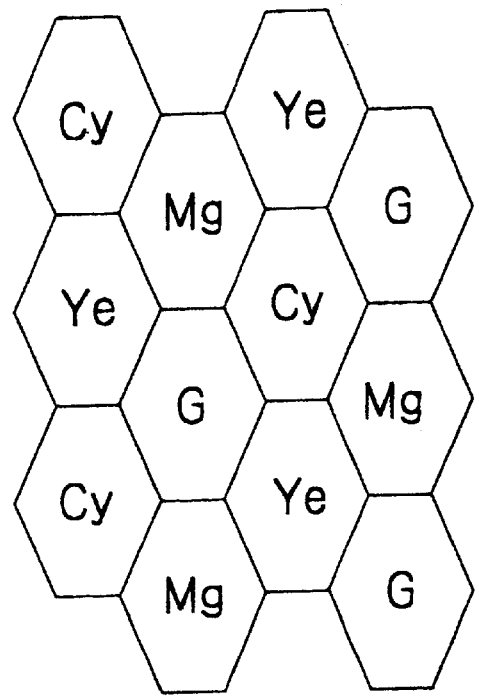
FIGS. 9A and 9B are views respectively showing a first and a second pattern that are applied to a color filer included in the illustrative embodiment.
Figure 9B:
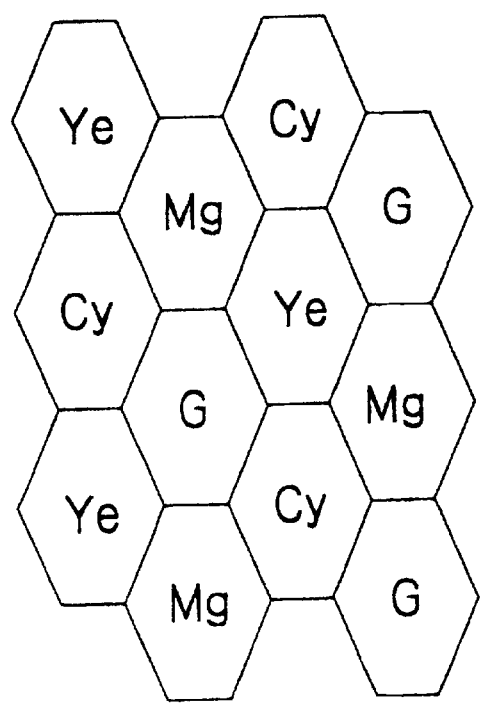

FIG. 9A shows a first specific pattern in which G (first color) filter segments, Mg (second color) filter segments, Ye (third color) filter segments and Cy (fourth color) filter segments are arranged. An array of adjoining filter segments of the same color is dealt with as a single unit and extends at an angle of 45° relative to the vertical. Such arrays of G, Mg, Cy and Ye are spread all over bidimensionally in parallel. More specifically, when the color filter segments are arranged in a tetragonal lattice pattern, the segments positioned at each diagonal are of the same color. Stated another way, there are combined a tetragonal, G and Mg lattice pattern and a pattern identical therewith except that it has Ye at the center and includes Cy as another color. FIG. 9B shows a second specific pattern in which the third color and fourth color filter segments of FIG. 9A are replaced with each other.

The G and Mg filter segments are dealt with as a first group. Signals actually generated in accordance with the spectral characteristic of the G and Mg filter segments are multiplied by 2 and 1, respectively. The Ye and Cy filter segments are dealt with as a second group and both are multiplied by 1. Paying attention to primary colors, the products of the first and second groups are expressed as:

$$2G + Mg = 2G + R + B \quad (5a)$$

$$\begin{aligned} Ye + Cy &= R + G + G + B \\ &= 2G + R + B \end{aligned} \quad (5b)$$

The equations (5a) and (5b) are equal to each other. FIG. 10 shows this relation in terms of spectral characteristic. In FIG. 10, curves 130 and 132 are representative of the equations (5a) and (5b), respectively. If the results of the equations (5a) and (5b), i.e., the sums of the products of the spectral characteristics and constants each lie in, e.g., a range of about ±10%, then the stripe-like noise does not appear, although the curves 130 and 132 do not define such a relation specifically.

Figure 11:
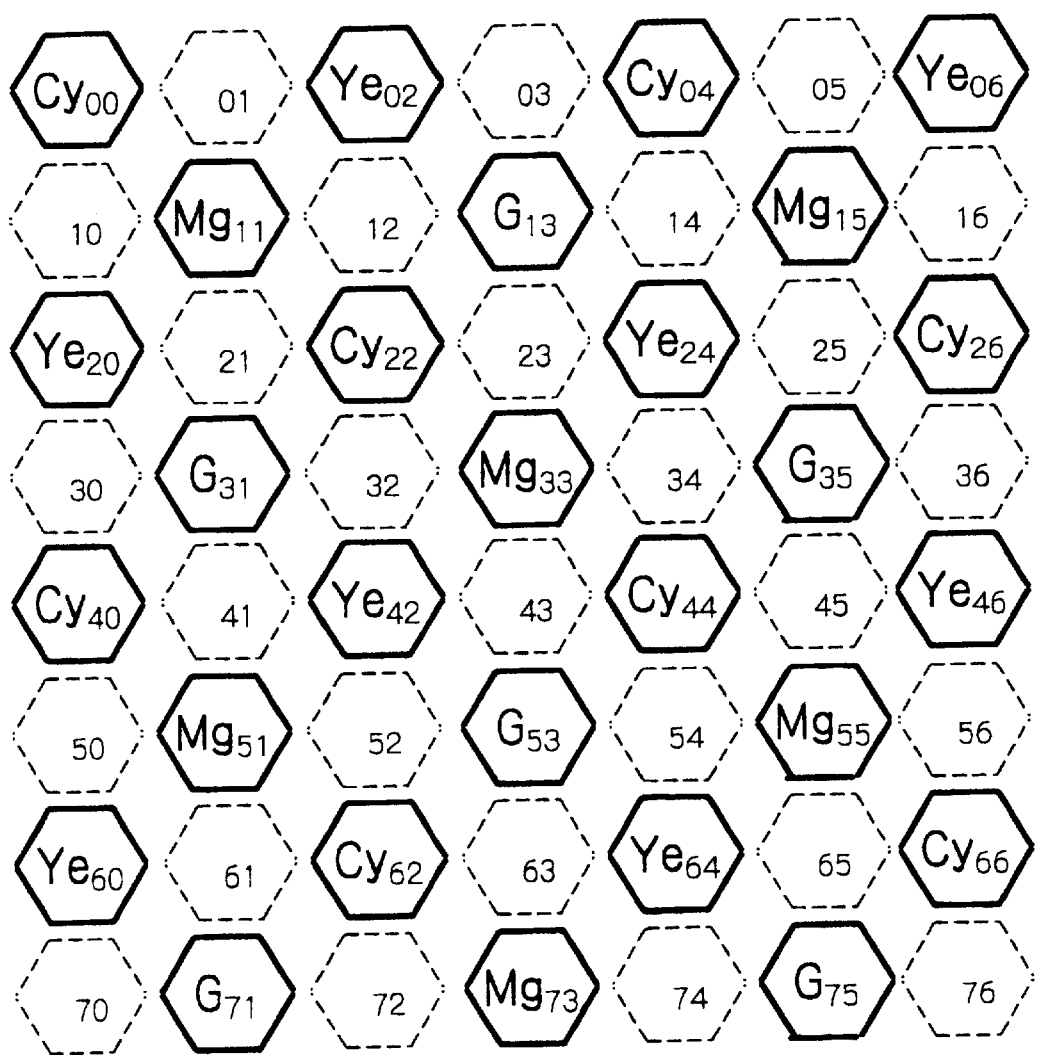
FIG. 11 is a view showing the first pattern of FIG. 9A while attaching positions in a matrix.

In the interpolator 32b, the $Y_H$ generator 52 generates high-frequency luminance data $Y_H$ in accordance with non-correlation, horizontal correlation or vertical correlation. FIG. 11 shows a pattern in which the pattern of FIG. 9A is repeatedly arranged with positions in a matrix attached thereto. As for virtual pixels (2,1) and (1,2), when no correlation exists or when vertical correlation exists, high-frequency luminance data $Y_H$ are respectively produced by:

$$\begin{aligned} Y_{H21} &= (2G_{31} + Cy_{22} + Mg_{11} + Ye_{20})/2 \\ &= (2G + G + B + R + B + R + G)/2 \\ &= 2G + R + B \end{aligned} \quad (6a)$$

$$\begin{aligned} Y_{H21} &= Mg_{11} + 2G_{31} \\ &= R + B + 2B \\ &= 2G + R + B \end{aligned} \quad (6b)$$

$$\begin{aligned} Y_{H12} &= Ye_{02} + Cy_{22} \\ &= R + G + G + B \\ &= 2G + R + B \end{aligned} \quad (6c)$$

As the equations (6a) through (6b) indicate, as far as the relation between primary colors is concerned, high-frequency luminance data $Y_H$ are generated with the same color balance both when correlation does not exist and when it exists in the vertical direction. Consequently, the stripe-like noise ascribable to the unbalance of colors is minimized. Further, the luminance data $Y_H$ contributes more to high resolution when generated on the basis of correlation than when generated in the absence of correlation.

On the other hand, assume that the virtual pixels (2,1) and (1,2) both have correlation in the horizontal direction. Then, high-frequency luminance data $Y_{H21}$ and $Y_{H12}$ for the pixels (2,1) and (1,2) are respectively produced by:

$$\begin{aligned} Y_{H21} &= Ye_{20} + Cy_{22} \\ &= R + G + G + B \\ &= 2G + R + B \end{aligned} \quad (7a)$$

$$\begin{aligned} Y_{H12} &= Mg_{11} + 2G_{13} \\ &= R + B + 2G + (= 2G + R + B) \end{aligned} \quad (7b)$$

Color balance can therefore be maintained even when correlation exists in the horizontal direction, successfully obviating the stripe-like noise.

Subsequently, the $Y_H$ generator 52 uses the high-frequency luminance data $Y_H$ interpolated in the virtual pixels to generate high-frequency luminance data $Y_H$ for the actual photosensitive cells 90 or actual pixels. As for pixels (1,1) and (2,2), for example, high-frequency pixel data $Y_{H11}$ and $Y_{H22}$ are generated when no correlation exists or when it exists by the following equations:

$$\begin{aligned} Y_{H11} &= (Y_{H10} + Y_{H01} + Y_{H21} + Y_{H12})/4 \\ &= 4(2G + R + B)/4 \\ &= 2G + R + B \end{aligned} \quad (8a)$$

$$\begin{aligned} Y_{H11} &= Y_{H01} + Y_{H21}/2 \\ &= 2(2G + R + B)/2 \\ &= 2G + R + B \end{aligned} \quad (8b)$$

$$\begin{aligned} Y_{H22} &= Y_{H12} + Y_{H32} \\ &= 2(2G + R + B)/2 \\ &= 2G + R + B \end{aligned} \quad (8c)$$

$$\begin{aligned} Y_{H11} &= Y_{H10} + Y_{H12}/2 \\ &= 2(2G + R + B)/2 \\ &= 2G + R + B \end{aligned} \quad (8d)$$

$$\begin{aligned} Y_{H22} &= Y_{H21} + Y_{H23} \\ &= 2(2G + R + B)/2 \\ &= 2G + R + B \end{aligned} \quad (8e)$$

The high-frequency luminance data $Y_H$ used for the above interpolation are originally balanced in color without regard to the presence/absence of correlation, as stated earlier. Obviously, therefore, the interpolation does not effect color balance at all.

By the above interpolation procedure, it is possible to obviate the stripe-like noise that noticeably degrades image quality. For example, when such noise is not visible at all or is slightly visible, the previously mentioned LPF processing, which would cancel enhanced resolution, is not necessary or a minimum of LPF processing suffices. That is, noise reduction is achievable at the same time as resolution enhancement.

A procedure for detecting correlation will be described hereinafter. The illustrative embodiment detects correlation by using pixel data of the same color. As shown in FIG. 11, the color filter segments of each color are arranged such that pixels are positioned at the four vertexes of a rhomb. Correlation is determined to exist if the result of calculation of correlation is greater than either one of preselected reference values $J_V$ and $J_H$, which are respectively assigned to vertical correlation and horizontal correlation. As for the actual pixel Cy (2,2), for example, the correlation of Ye is detected by using pixel data $Ye_{02}$, $Ye_{20}$, $Ye_{42}$ and $Ye_{24}$:

$$|Ye_{20} - Ye_{24}| - |Ye_{02} - Ye_{42}| > J_V \quad (9a)$$

$$|Ye_{02} - Ye_{42}| - |Ye_{20} - Ye_{24}| > J_H \quad (9b)$$

If either one of the above relations (9a) and (9b) holds, then correlation is determined to exist in the vertical direction or the horizontal direction, respectively. This is because a smaller difference between the pixel data indicates closer correlation. If neither one of the relations (9a) and (9b) holds, it is determined that correlation does not exist in any direction.

For a virtual pixel, correlation is determined on the basis of four pixel data surrounding the virtual pixel. For a virtual pixel (4,3), for example, use is made of the results of correlation detection respectively assigned to four pixel data $Mg_{33}$, $G_{53}$, $Ye_{42}$ and $Cy_{44}$ surrounding the virtual pixel (4,3). If three or more of the results of vertical correlation detection assigned to the pixel data $Mg_{33}$ through $Cy_{44}$ indicate correlation, the virtual pixel (4,3) is determined to have vertical correlation. Likewise, the virtual pixel (4,3) is determined to have horizontal correlation if three or more of the above four pixel data indicate horizontal correlation. If such a condition is not satisfied, it is determined that the virtual pixel (4,3) has no correlation. If desired, the condition for the decision may be eased to at least two pixel data in place of at least three pixel data.

The RGB generator 54, FIG. 3, generates primary color data for the complementary color pixels and virtual pixels, as will be described hereinafter. Referring again to FIG. 11, as for the virtual pixel (2,1) by way of example, primary color data $R_{21}$, $G_{21}$ and $B_{21}$ are respectively produced by:

$$\begin{aligned} R_{21} &= (Mg_{11} + Ye_{20} - Cy_{22})/2 \\ &= (R + B + R + G - G - B)/2 \\ &= 2R/2 \\ &= R \end{aligned} \quad (10a)$$

$$\begin{aligned} G_{21} &= (G_{31} + Cy_{22} + Ye_{20} - Mg_{11})/3 \\ &= (G + G + B + R + G - R - B)/3 \\ &= 3G/3 \\ &= G \end{aligned} \quad (10b)$$

$$\begin{aligned} G_{21} &= (2G_{31} + Cy_{22} + Ye_{20} - Mg_{11})/4 \\ &= (2G + G + B + R + G - R - B)/4 \\ &= (4G/4) \\ &= G \end{aligned} \quad (10c)$$

$$\begin{aligned} B_{21} &= (Mg_{11} + Cy_{22} - Ye_{20})/2 \\ &= (R + B + G + B - R - G)/2 \\ &= 2B/2 \\ &= B \end{aligned} \quad (10d)$$

As stated above, primary color data can be produced on the basis of surrounding pixel data by four arithmetic rules. As for each actual pixel, primary color data is produced as a mean value of the primary color data of four surrounding virtual pixels. LPF processing should preferably be executed with the primary color data generated for the virtual pixels and actual pixels because such data sometimes contain false color signals.

The procedures for generating high-frequency luminance data $Y_H$, detecting correlation and generating primary color data described above are similarly applicable to the filter pattern shown in FIG. 9B.

Figure 12:
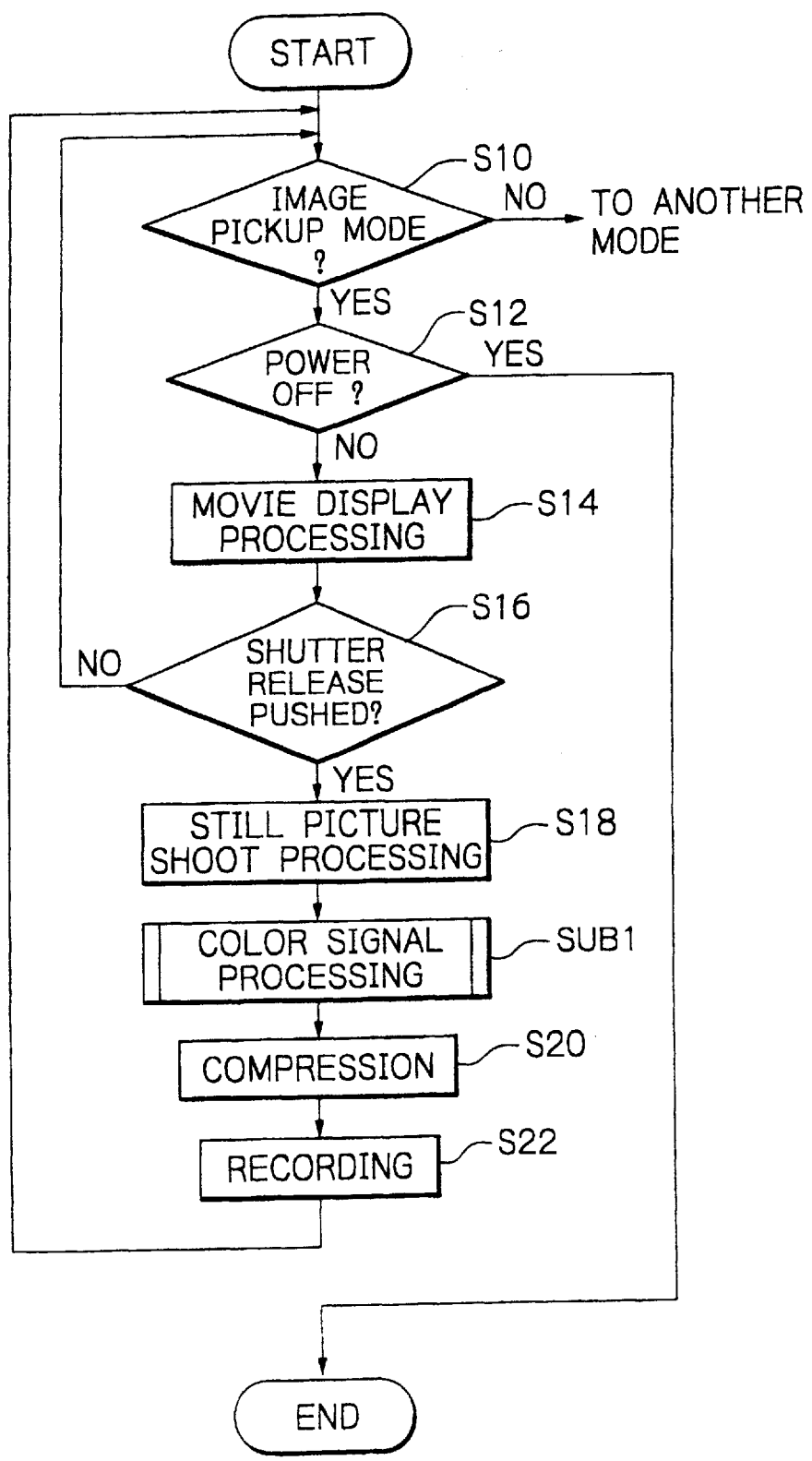
FIG. 12 is a flowchart demonstrating a specific operation of the illustrative embodiment.

A specific operation of the camera 10 will be briefly described with reference to FIG. 12. As shown, after various kinds of initial setting that follows the turn-on of a power switch, not shown, whether or not the operator has selected a pickup mode is determined (step S10). If the answer of the step S10 is YES, then whether or not the operator has turned off the power switch is determined (step S12); if otherwise, (NO, step S10), a routine assigned to another mode is executed.

If the operator has turned off the power (YES, step S12), then the operation of the camera 10 ends. If the answer of the step S12 is NO, movie display processing is executed (step S14). Subsequently, whether or not the operator has pressed the shutter release button to a full-stroke position is determined (step S16). If the answer of the step S16 is YES, then the system controller 18 picks up a scene via the image sensor 26 in the form of a still picture (step S18). If the answer of the step S16 is NO, the operation returns to the step S10.

Specifically, in the step S18, the photosensitive cells 90 transform incident light separated in color by the color filter 26a to corresponding signal charges. The resulting image signals 27 are input to the ADC 30 via the analog processor 28 and then written to the frame memory circuit 32a in the form of digital image data. The complementary color filter 26a can use incident light more efficiently than a primary color filter, as stated previously.

More specifically, the analog processor 28 adjusts the gain of the image signal 27 and feeds the adjusted signal to the ADC 30 as an analog signal 29. The ADC 30 converts the analog signal 29 to a digital signal or image data 31 and delivers the image data 31 to the signal processing section 32. The signal processing section 32 writes the image data 31 in the frame memory circuit 32a. Subsequently, the image data 44 are read out of a particular region of the frame memory circuit 32a, which should be processed, under the control of the system controller 18.

The interpolator 32b interpolates various signals in accordance with color signal processing (subroutine SUB1, FIG. 12), which will be described in detail later. Briefly, the subroutine SUB1 executes interpolation and luminance and chrominance signal processing. Taking account of, e.g., correlation between pixel data, the interpolator 32b generates high-frequency luminance data $Y_H$, low-frequency luminance data $Y_L$ and primary color data for the actual pixels and virtual pixels, as will be described more specifically later. As a result, five different kinds of data are generated for a single frame. These data are input to the luminance and chrominance processor 32c. The processing circuit 32c generates luminance data Y and chrominance data $C_r$ and $C_b$. The data Y, $C_r$ and $C_b$ are so processed as to enhance resolution and then input to the compander 34.

The compander 34 compresses the input data Y, $C_r$ and $C_b$ by, e.g., reducing the amount of data in accordance with the JPEG standards (step S20). The resulting data 35 are written to the storage 36, which has a storing function, on the system bus 16 (step S22). Thereafter, the operation returns to the step S10.

Figure 13:
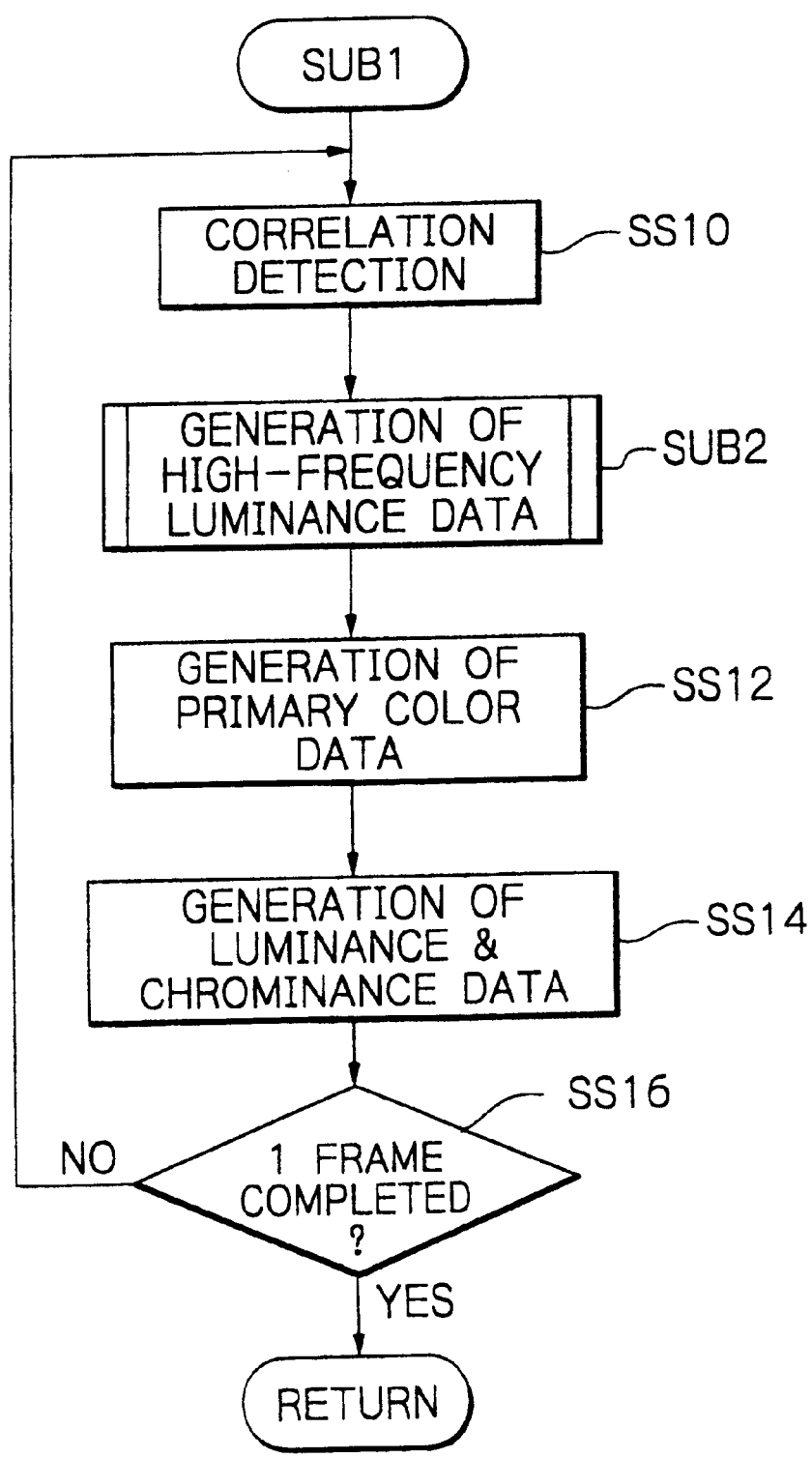
FIG. 13 is a flowchart showing a subroutine SUB1 included in the flowchart of FIG. 12 specifically.

The subroutine SUB1 will be described in detail with reference to FIG. 13. As shown, the subroutine SUB1 begins with a substep SS10 for correlation detection. In the substep SS10, four pixel data of the same color as the pixel data to be examined are read out of a preselected region of the frame memory circuit 32a. At this time, an address assigned to the pixel data to be examined is also read out of the frame memory 32a. The address may be the address of the image sensor 26 or that of the frame memory 40, as desired. The four pixel data 44 lying in the preselected region and actual pixels are used to determine correlation by using, e.g., the equations (9a) and (9b).

Subsequently, high-frequency luminance data $Y_H$ are generated for the actual pixels and virtual pixels by particular processing assigned to each result of correlation detection (subroutine SUB2; see FIG. 14). high-frequency luminance data $Y_H$ for a virtual pixel is produced from two or four pixel data surrounding it. During interpolation, primary color data are produced from the actual pixels and virtual pixels (substep SS12). These high-frequency luminance data $Y_H$ and primary color data are used to generate a luminance signal and chrominance signals (substep SS14). Subsequently, whether or not the above processing has been repeated throughout one frame is determined (substep SS16) If the answer of the substep SS16 is NO, then the operation returns to the substep SS10. If the answer of the substep SS16 is YES, the subroutine SUB1 ends.

Figure 14:
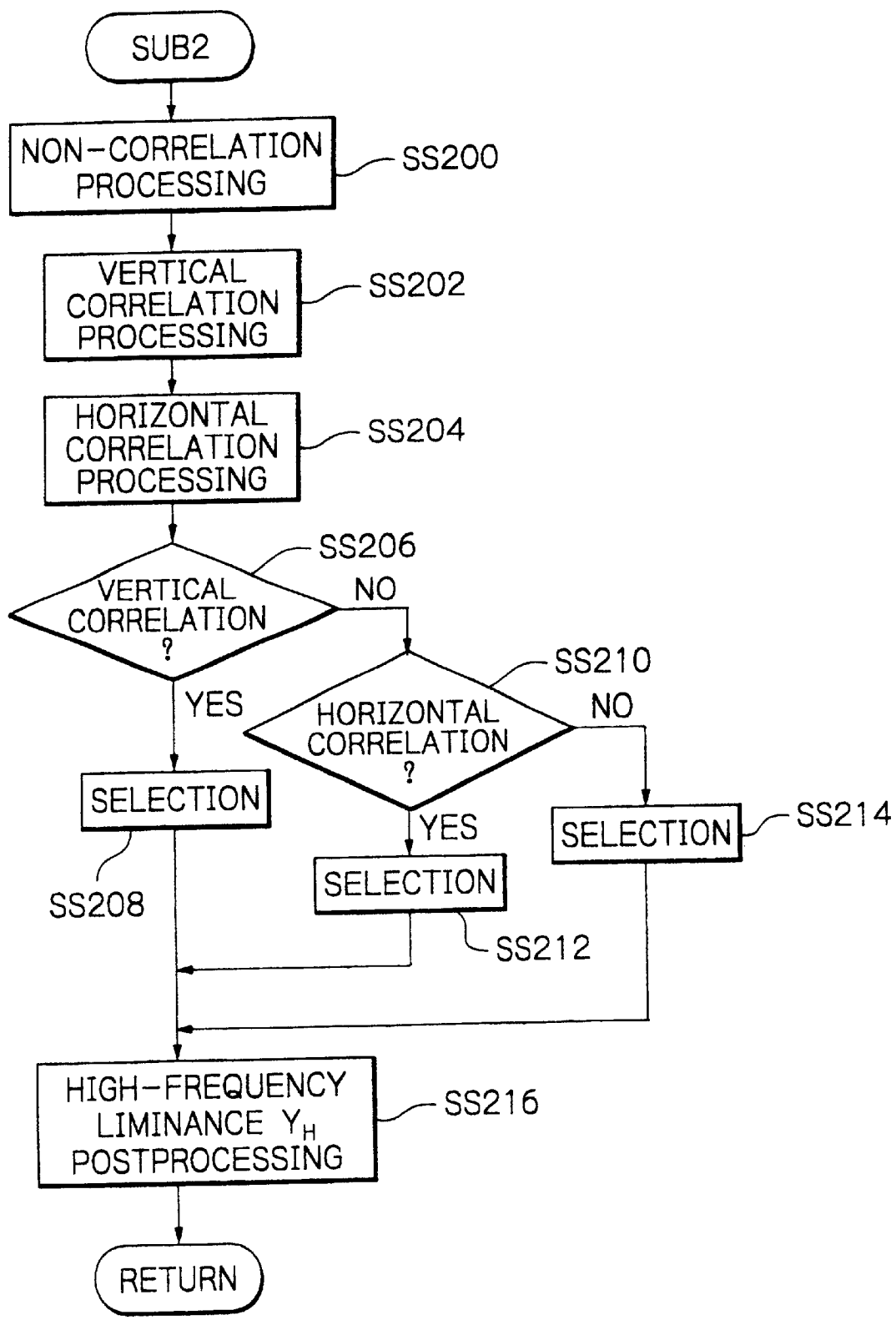
FIG. 14 is a flowchart showing a subroutine SUB2 included in the flowchart of FIG. 13 specifically.

The subroutine SUB2 will be described more specifically with reference to FIG. 14. The system controller 18 causes pixel data around pixel data, which is to be generated, and lying in a preselected region to be read out of the frame memory 32a. As shown in FIG. 14, the subroutine SUB2 begins with a substep SS200 in which, e.g., four of the above surrounding pixel data are added and then averaged, as represented by the equation (6a) by way of example (non-correlation processing)

After the substep SS202, e.g., two of the surrounding pixel data are added and then averaged, as represented by the equations (6b) and (6c) by way of example (substep SS202; vertical correlation processing). Also, two of the surrounding pixel data are added and then averaged, as indicated by the equations (7a) and (7b) by way of example (substep SS204; horizontal correlation processing).

On the other hand, the correlation detector 50 delivers the previously mentioned correlation signal 56 representative of the result of detection to the $Y_H$ switch 66. In response, the $Y_H$ switch 66 selects one of the results of vertical correlation, horizontal correlation and non-correlation. The steps SS200 through SS204 described so far correspond to the decision on the kind of correlation of a pixel being observed.

For example, whether or not the correlation detected is vertical correlation is determined (substep SS206). If the answer of the substep SS206 is YES, then the high-frequency luminance data $Y_H$ generated by the vertical correlation processing is selected (substep SS208). If the answer of the substep SS206 is NO, whether or not the correlation signal 56 is representative of horizontal correlation is determined (substep SS210).

If the answer of the substep SS210 is YES, then the high-frequency luminance data $Y_H$ generated by the horizontal correlation processing is selected (substep SS212). If the answer of the substep SS210 is NO, meaning that neither vertical correlation nor horizontal correlation exists, the high-frequency luminance data $Y_H$ generated by the non-correlation processing is selected (substep SS214).

The substep SS208, SS212 or SS214 is followed by high-frequency luminance signal $Y_H$ postprocessing (substep SS216). Specifically, the high-frequency luminance data are combined and then subjected to edge enhancement, which uses a low-pass filter or a high pass filter. This is the end of the subroutine SUB2.

It is preferable to store the results of pixel-by-pixel correlation detection together with the addresses of the pixels. In this case, to interpolate high-frequency luminance data $Y_H$ in an actual pixel, use is made of the luminance data $Y_H$ of virtual pixels whose correlation has been determined.

When three or more of the results of correlation detection are identical, it is determined that horizontal or vertical correlation exists. If otherwise, correlation is determined to be absent, so that high-frequency luminance data $Y_H$ is generated by the non-correlation processing. In this manner, high-frequency luminance data $Y_H$ may be generated on a majority basis. More specifically, when horizontal or vertical correlation exists, two pixel data correlated to each other at opposite sides of a pixel being observed are added and then averaged to generate high-frequency luminance data $Y_H$. If correlation does not exist, four pixels around the pixel data being observed are used to generate high-frequency luminance data $Y_H$.

A procedure for calculating primary color data for the actual pixels and virtual pixels will be briefly described hereinafter. Assume that primary color data $R_{21}$, $G_{21}$ and $B_{21}$ should be generated for the virtual pixel (2,1) shown in FIG. 11. Then, the primary color data $R_{21}$ is produced by the equation (10a). Four actual pixels derived from the respective color filter segments exist around the virtual pixel (2,1).

Therefore, paying attention to the primary color component, the primary color data $R_{21}$ is produced by:

$$R=(Mg+Ye-Cy)/2 \qquad (11)$$

When the virtual pixel (2,1) is seen in the horizontal direction, the actual pixels surrounding it do not include G. Sampling should therefore be effected in a zigzag fashion.

The primary color data $G_{21}$ for the virtual pixel (2,1) is produced by either one of the equations (10b) and (10c). In this case, all of the four actual pixels of different colors surrounding the virtual pixel (2,1) are used. The equation (10c) should preferably be used because the illustrative embodiment multiplies the color G by 2. Paying attention to the primary color component, the data $G_{21}$ is expressed as:

$$G=(2G+Cy+Ye-Mg)/4 \qquad (12)$$

The primary color data $B_{21}$ is produced from three actual pixels of different colors around the virtual pixel (2,1) by the equation (10d). Paying attention to the primary color component, the data $B_{21}$ is produced by:

$$B=(Mg+Cy-Ye) \qquad (13)$$

Again, the pixel data should preferably be sampled in a zigzag fashion.

Next, primary color data for the actual pixels are generated. As for primary color data R, four or two data of the same color interpolated in surrounding pixels are added and then averaged. This is also true with the other primary color data G and B.

The above-described procedure for generating high-luminance frequency data $Y_H$ and primary color data is not only illustrative. In an alternative procedure, one frame of data are generated for the virtual pixels or the actual pixels, and then data are interpolated in non-processed regions or positions. The alternative procedure is more efficient than the previous procedure.

With the operation described above, the illustrative embodiment realizes an image preserving improved resolution.

Figure 15:
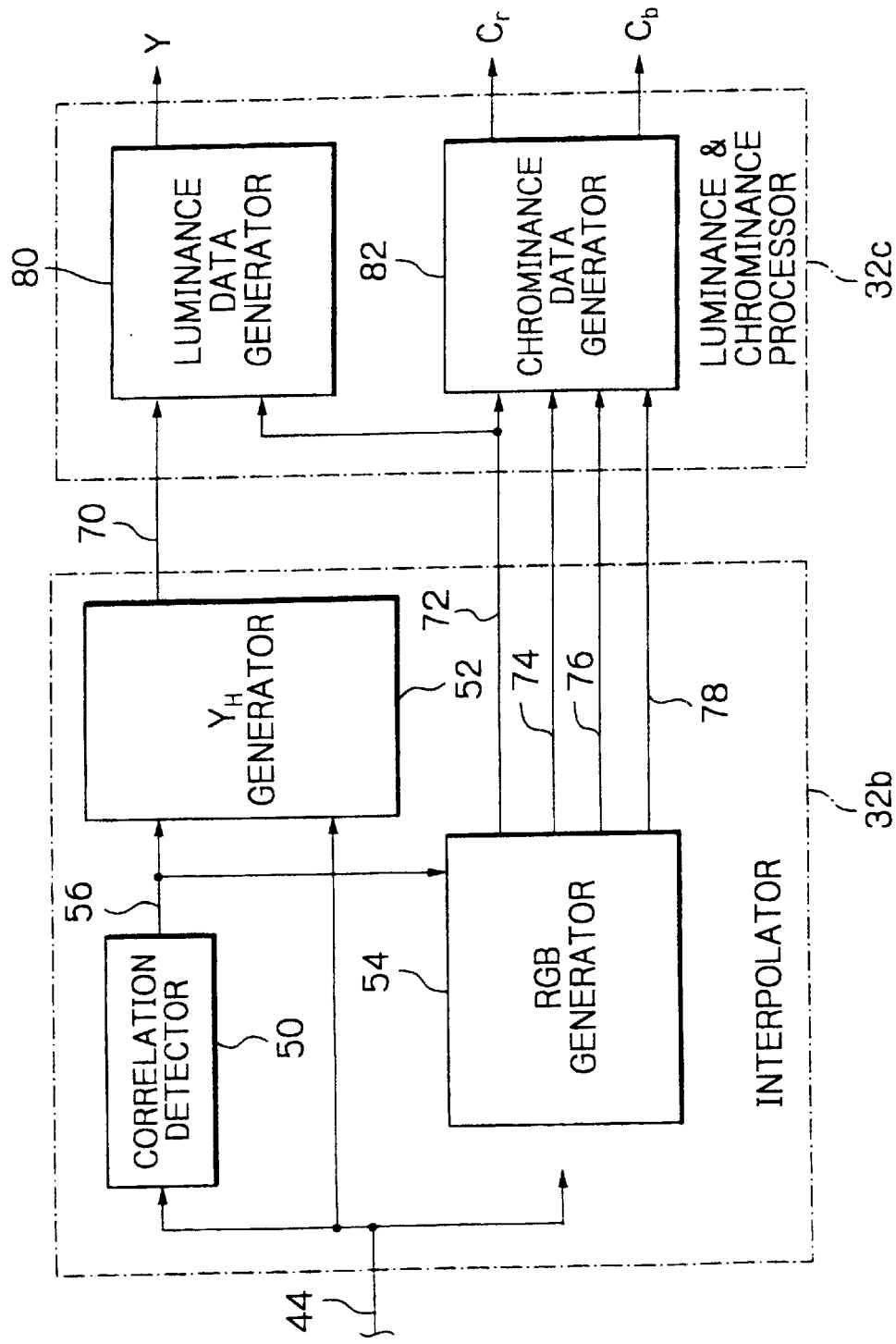
FIG. 15 is a schematic block diagram showing an alternative embodiment of the present invention.
Figure 16:
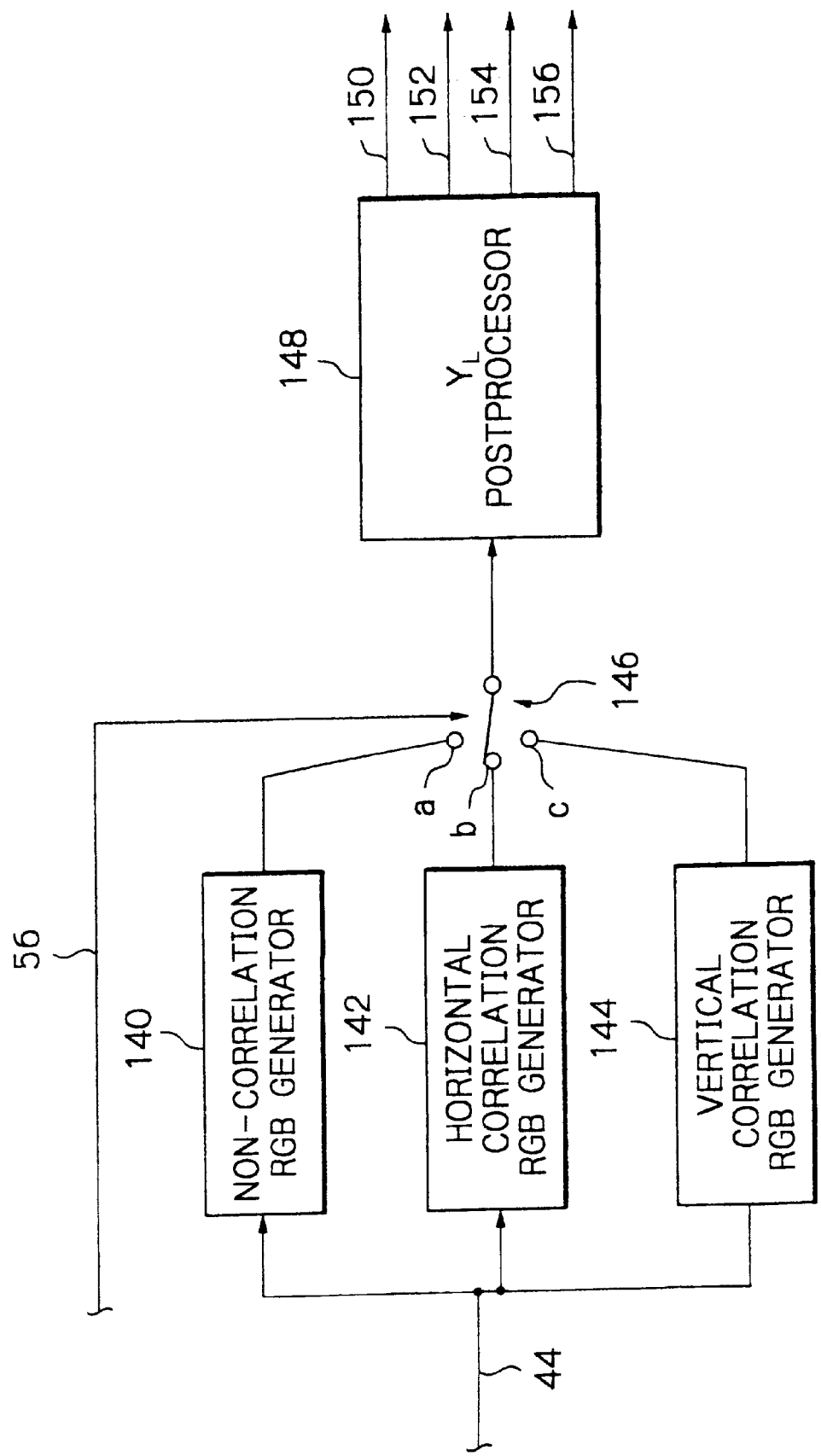
FIG. 16 is a schematic block diagram showing an RGB generator included in the alternative embodiment.

Reference will be made to FIGS. 15 and 16 for describing an alternative embodiment of the present invention. As shown, this embodiment differs from the previous embodiment in that the correlation signal 56 output from the correlation detector 50 is input to the RGB generator 54 also. The RGB generator 54 generates primary color data R, G and B on the basis of the result of correlation detection.

Specifically, as shown in FIG. 16, the RGB generator 54 includes a non-correlation RGB generator 140, a horizontal correlation RGB generator 142, a vertical correlation RGB generator 144, an RGB switch or selector 146, and a $Y_L$ postprocessor 148. The RGB generators 140 through 144 each receives the pixel data 44 read out of the frame memory 40, FIG. 2, and each generates primary color data R, G and B on the basis of the presence/absence and direction of correlation. More specifically, the RGB generators 140 through 144 each generates primary color data for the virtual pixels and then generates primary color data for the actual pixels by using the primary color data assigned to the virtual pixels.

More specifically, the non-correlation RGB generator 140 adds and then averages, color by color, four virtual pixels around the photosensitive cell 90 being observed. The horizontal correlation RGB generator 142 adds and then averages, color by color, two virtual pixels sandwiching the photosensitive cell 90 being observed in the horizontal direction. The vertical correlation RGB generator 144 adds and then averages, color by color, two virtual pixels sandwiching the photosensitive cell 90 being observed in the vertical direction. For this purpose, the RGB generators 140 through 144 each produces low-frequency luminance data $Y_L$ as well, by substituting primary color data for the following exemplary equation:

$$Y_L=0.3 \times R+0.59 \times G+0.11 \times B \qquad (14)$$

By generating data relating to colors on the basis of primary color data, which are derived from correlation, it is possible to enhance the resolution of an image.

The RGB switch 146 has terminals a, b and c connected to the RGB generators 140 through 144, respectively. The RGB switch 146 selects one of the outputs of the RGB generators 140 through 144 in accordance with the correlation signal 56. The RGB switch 146 delivers to the $Y_L$ postprocessor 148 the primary color data based on the correlation of both of the virtual pixels and actual pixels. In this manner, the illustrative embodiment generates pixel data by estimating the result of correlation detection beforehand. This is successful to reduce the processing time.

The $Y_L$ postprocessor 148 executes gain adjustment, LPF processing and so forth with all of the various kinds of data assigned to the actual pixels and virtual pixels, thereby outputting low-frequency luminance data $Y_L$ 150, and primary color data 152 through 156.

The illustrative embodiments shown and described have concentrated on a CCD area sensor type of solid-state image sensor to be scanned by interlacing. This type of image sensor may, of course, be replaced with a progressive scanning type of CCD area sensor or a four field, interlace scanning type of CCD area sensor. The crux is that the image sensor has photosensitive cells arranged in a honeycomb pattern, i.e., horizontally and vertically shifted from each other by a distance that is one half of the distance between the cells on the same row and same column.

Figure 17:
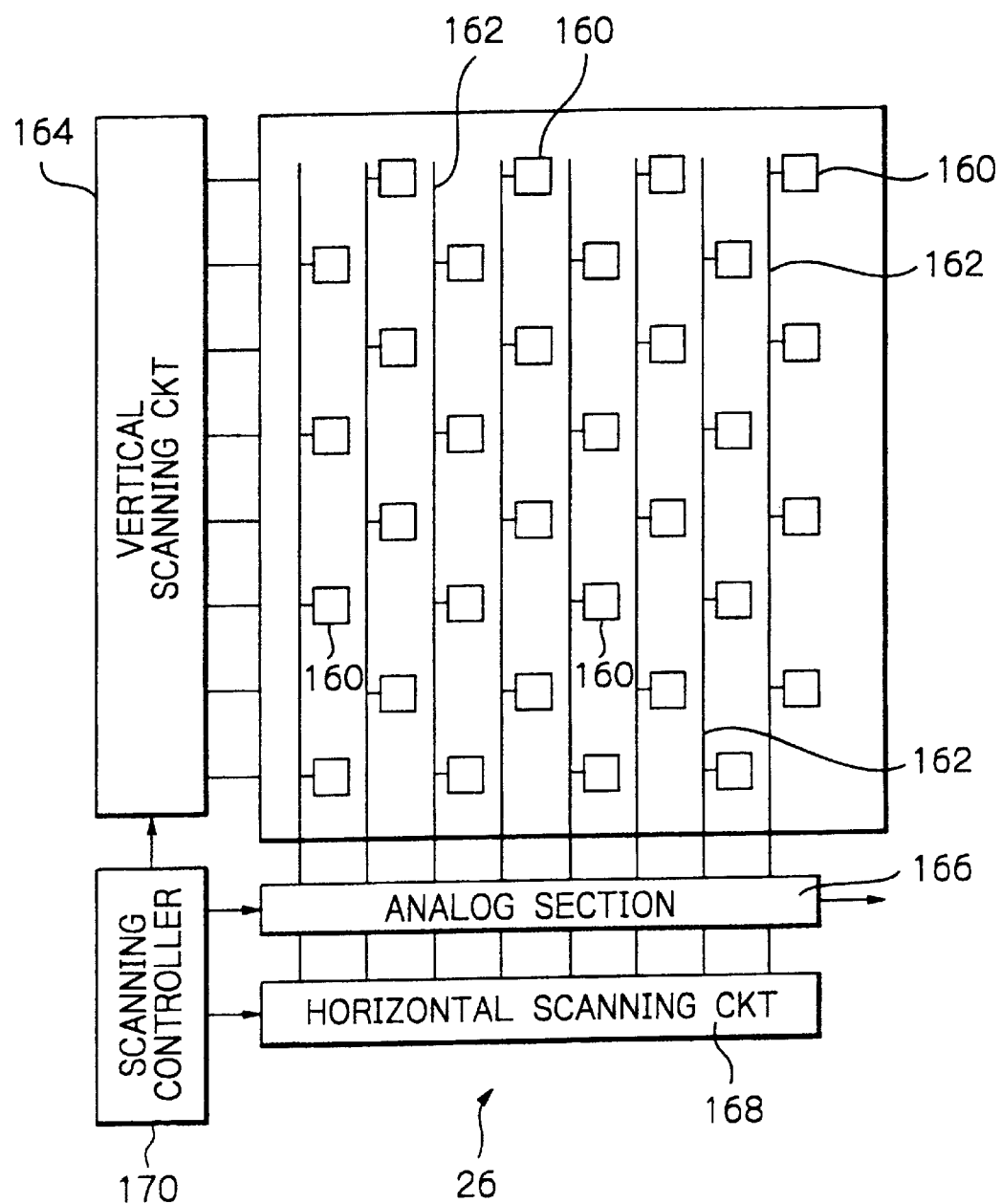
FIG. 17 is a view showing the general arrangement of MOS (Metal Oxide Semiconductor) type solid-state photosensitive cells also applicable to the image sensor of FIG. 1.

FIG. 17 shows a MOS type solid-state image sensor that also enhances resolution when applied to the camera 10. The image sensor shown in FIG. 17 is substantially identical in configuration with a conventional image sensor of this type. Of course, the color filter segments arranged in the pattern of FIGS. 9A or 9B are applied to the image sensor.

As shown in FIG. 17, the MOS type solid-state image sensor, also labeled 26, has photosensitive cells 160 arranged bidimensionally in the honeycomb pattern. Signal lines 162 vertically extend in the vicinity of the photosensitive cells 160. MOS switches, riot shown, are formed between the photosensitive cells 160 and the signal lines 162.

A vertical scanning circuit 164 feeds, e.g., ON/OFF signals to the MOS switches in order to cause signals to be stored in the photosensitive cells 160 and read thereoutof. The signals read out of the photosensitive cells 160 are input to an analog section 166. A horizontal scanning circuit 168 feeds scanning signals to the analog section 166 such that the signals input to the analog section 166 are output in the horizontal direction. A scanning controller 170 controls the vertical scanning circuit 164 and horizontal scanning circuit 168 by feeding scanning start timing signals and other timing signals thereto. With this configuration, the image sensor 26 is capable of receiving light with high efficiency and outputting the analog signals 27 at a desired timing.

As stated above, in the illustrative embodiment, use is made of color filter segments including complementary colors. Signal charges are generated in photosensitive cells through the color filter segments. High-frequency luminance data $Y_H$ for actual pixels and virtual pixels produced by signal processing are generated in accordance with the result of correlation detection. This is also successful to substantially obviate the variation of the luminance data $Y_H$ and therefore stripe-like noise ascribable thereto. This practically eliminates the need for LPF processing, which lowers resolution, or needs a minimum of LPF processing. It follows that an image broadened in frequency band and therefore enhanced in resolution is directly output. Consequently, a color image with enhanced both in sensitivity and resolution is achievable.

The color filter segments, constituting a color filter, each has a particular spectral characteristic. Two of the sums of products of the segment-by-segment spectral characteristics and corresponding constants are substantially equal to each other. This not only promotes the efficient use of incident light, but also enhances resolution even when the pixel data are processed at a subsequent stage.

Further, the pixel data of each color is multiplied by a particular constant and corrected thereby. Therefore, so long as the above relation between the color filter segments holds, high-frequency luminance data $Y_H$ can be calculated on the basis of the pixel data corrected in accordance with the result of correlation detection, insuring a high resolution, color image.

In summary, it will be seen that the present invention provides a solid-stated image pickup apparatus and a signal processing method capable of enhancing the sensitivity and resolution of an image.

The entire disclosure of Japanese patent application No. 2000-101226 filed on Mar. 31, 2000 including the cation, claims, accompanying drawings and abstract of closure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit present invention.

What is claimed is:

1. A solid-state image pickup apparatus for separating colors of incident light at positions corresponding to apertures of shield members, which shield the incident light, transforming the incident light separated in color to a corresponding signal, and processing said signal to thereby broaden a frequency band of said signal, said apparatus comprising:

a solid-state image sensor comprising:
   a color filter comprising color filter segments, which include complementary color filter segments as to a spectral characteristic, for separating the incident light input through the apertures into a plurality of colors each having a particular spectral characteristic;
   a sensor array comprising photosensitive cells each for transforming the incident light input through a particular one of the color filter segments to a signal charge, wherein nearby ones of said photosensitive cells are shifted from each other in at least one of a vertical and a horizontal direction; and
   a reading circuit for sequentially reading out signal charges generated in the photosensitive cells in a preselected order to thereby output said signal charges as an output signal;
a digitizing circuit for digitizing the output signal for thereby outputting pixel data; and
a signal processing circuit for detecting, by assuming actual pixels derived from positions where said photosensitive cells are present and virtual pixels intervening between said actual pixels, a correlation of the pixel data in at least one of the horizontal and vertical directions, multiplying each of said pixel data by a particular constant in accordance with a color of the color filter segment to thereby generate corrected pixel data, producing, based on the correlation detected, high-frequency luminance data including high-frequency components for said actual pixels and said virtual pixels while producing, based on said pixel data, three primary color data, and generating data relating to luminance and chrominance on the basis of resulting different kinds of pixel data;

wherein said color filter includes a first group of color filter segments of a first and a second color positioned on a same row and a second group of color filter segments of a third and a fourth color positioned on a same row, said first group of color filter segments and said second group of filter segments, which adjoin each other, being shifted from each other by one-half of a pixel pitch; and wherein the color filter segments are arranged such that a first sum of products and a second sum of products, which are respectively produced by multiplying the spectral characteristic of said first group by a first and a second constant and multiplying the spectral characteristic of said second group by a third and a fourth constant, are substantially equal to each other, and such that said first and second sums have a relation close to a spectral characteristic representative of luminance.

2. The apparatus in accordance with claim 1, wherein assuming that the first sum is a sum of products respectively produced by multiplying the signal derived from, when white light is incident, the spectral characteristic of said first group and a spectral characteristic of said photosensitive cells by the first and second constants, and that the second sum is a sum of products respectively produced by multiplying the signal derived from, when white light is incident, the spectral characteristic of said second group and a spectral characteristic of said photosensitive cells by the third and fourth constants, said first sum lies in a range of substantially ±10% of said second sum.

3. The apparatus in accordance with claim 2, wherein the first color to the fourth color are green, magenta, yellow and cyan, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, yellow is positioned at one pair of diagonally opposite vertexes while cyan is positioned at the other pair of diagonally opposite vertexes.

4. The apparatus in accordance with claim 2, wherein the first color to the fourth color are green, magenta, cyan and yellow, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, cyan is positioned at one pair of diagonally opposite vertexes while yellow is positioned at the other pair of diagonally opposite vertexes.

5. The apparatus in accordance with claim 3, wherein the first constant is 2 while the second constant to the fourth constants are 1 each.

6. The apparatus in accordance with claim 4, wherein the first constant is 2 while the second constant to the fourth constants are 1 each.

7. The apparatus in accordance with claim 5, wherein said solid-state image sensor comprises either one of a CCD (Charge Coupled Device) image sensor and a MOS (Metal Oxide Semiconductor) image sensor.

8. The apparatus in accordance with claim 6, wherein said solid-state image sensor comprises either one of a CCD image sensor and a MOS image sensor.

9. A solid-state image sensor for separating incident light at positions corresponding to apertures of shield members, which shield the incident light, and transforming the incident light to a corresponding signal, said sensor comprising:
- a color filter comprising color filter segments, which include complementary color filter segments as to a spectral characteristic, for separating the incident light input through the apertures into a plurality of colors each having a particular spectral characteristic;
- a sensor array comprising photosensitive cells each for transforming the incident light input through a particular one of the color filter segments to a signal charge, wherein nearby ones of said photosensitive cells are shifted from each other in at least one of a vertical and a horizontal direction; and
- a reading circuit for sequentially reading out signal charges generated in the photosensitive cells in a preselected order to thereby output said signal charges as an output signal;
- wherein said color filter includes a first group of color filter segments of a first and a second color positioned on a same row and a second group of color filter segments of a third and a fourth color positioned on a same row, said first group of color filter segments and said second group of filter segments, which adjoin each other, being shifted from each other by one-half of a pixel pitch; and
- wherein said color filter segments are arranged such that a first sum of products and a second sum of products, which are respectively produced by multiplying the spectral characteristic of said first group by a first and a second constant and multiplying the spectral characteristic of said second group by a third and a fourth constant, are substantially equal to each other, and such that said first and second sums have a relation close to a spectral characteristic representative of luminance.

10. The apparatus in accordance with claim 9, wherein assuming that the first sum is a sum of products respectively produced by multiplying the signal derived from, when white light is incident, the spectral characteristic of the first group and a spectral characteristic of the photosensitive cells by the first and second constants, and that the second sum is a sum of products respectively produced by multiplying the signal derived from, when white light is incident, the spectral characteristic of the second group and the spectral characteristic of the photosensitive cells by the third and fourth constants, said first sum lies in a range of substantially ±10% of said second sum.

11. The apparatus in accordance with claim 10, wherein the first color to the fourth color are green, magenta, yellow and cyan, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, yellow is positioned at one pair of diagonally opposite vertexes while cyan is positioned at the other pair of diagonally opposite vertexes.

12. The apparatus in accordance with claim 10, wherein the first color to the fourth color are green, magenta, cyan and yellow, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, cyan is positioned at one pair of diagonally opposite vertexes while yellow is positioned at the other pair of diagonally opposite vertexes.

13. The apparatus in accordance with claim 11, wherein the first constant is 2 while the second constant to the fourth constants are 1 each.

14. The apparatus in accordance with claim 12, wherein the first constant is 2 while the second constant to fourth constants are 1 each.

15. The apparatus in accordance with claim 13, wherein said solid-state image sensor comprises either one of a CCD image sensor and a MOS image sensor.

16. The apparatus in accordance with claim 14, wherein said solid-state image sensor comprises either one of a CCD image sensor and a MOS image sensor.

17. A signal processing method comprising:
- a first step of separating colors of light incident to a solid-state image sensor having a first group of color filter segments of a first and a second color positioned on a same line and a second group of color filter segments of a third and a fourth color positioned on a same line, wherein said first group of color filter segments and said second group of filter segments, which adjoin each other, are shifted from each other by one-half of a pixel pitch, and each corresponds to an aperture of one of shield members that shield incident light;
- a second step of causing photosensitive cells, each of which adjoins a one of the color filter segments, to transform the incident light separated in color to corresponding signal charges;
- a third step of reading out the signal charges in a form of an analog signal and processing said analog signal;
- a fourth step of converting said analog signal processed to a digital signal;
- a fifth step of writing the digital signal, in a form of pixel data, in a memory from which said pixel data can be repeatedly read out a plurality of times;
- a sixth step of detecting a correlation in at least one of a horizontal and a vertical direction by using the pixel data read out of the memory;
- a seventh step of multiplying each of the pixel data by a particular preselected constant assigned to a particular color to thereby generate corrected pixel data, and executing a calculation, which gives consideration to a direction of the correlation detected, with said corrected pixel data to thereby generate high-frequency luminance data containing high-frequency components;
- an eighth step of generating three primary color data by using the pixel data read out of the memory; and
- a ninth step of producing luminance data and chrominance data by using the high-frequency luminance data and the three primary color data;
- wherein in said seventh step signals derived from the photosensitive cells of the first color and the signals derived from the photosensitive cells of the second color are multiplied by a first and a second constant, respectively, resulting products are added to thereby produce a first sum, signals derived from the photosensitive cells of the third color and the signals derived from the photosensitive cells of the fourth color are multiplied by a third and a fourth constant, respectively, and resulting products are added to thereby produce a second sum, said first constant to said fourth constant being selected such that said first sum and said second sum have a relation close to a spectral characteristic representative of luminance.

18. The method in accordance with claim 17, wherein the first constant to the fourth constant are selected such that the first sum lies in a range of substantially ±10% of the second sum.

19. The method in accordance with claim 18, wherein in said first step the first color to the fourth color are green, magenta, yellow and cyan, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, yellow is positioned at one pair of diagonally opposite vertexes while cyan is positioned at the other pair of diagonally opposite vertexes.

20. The method in accordance with claim 18, wherein in said first step the first color to the fourth color are green, magenta, cyan and yellow, respectively, and wherein the color filter segments are arranged in a tetragonal lattice such that green is positioned at one pair of diagonally opposite vertexes while magenta is positioned at the other pair of diagonally opposite vertexes, and such that, in another tetragonal lattice extending from a center or an intermediate position of said tetragonal lattice, cyan is positioned at one pair of diagonally opposite vertexes while yellow is positioned at the other pair of diagonally opposite vertexes.

21. The method in accordance with claim 18, wherein the first constant is 2 while the second constant to the fourth constants are 1 each.

22. The method in accordance with claim 19, wherein the first constant is 2 while the second constant to the fourth constants are 1 each.

23. The method in accordance with claim 20, wherein the first constant is 2 while the second constant to the fourth constants are 1 each.

24. The method in accordance with claim 18, wherein assuming actual pixels derived from positions where the photosensitive cells are present and virtual pixels intervening between said actual pixels, said seventh step generates the high-frequency luminance data for the actual pixels or the virtual pixels by using, among the corrected pixel data, the corrected pixel data correlated in the horizontal direction or the vertical direction or by using a sum of the corrected pixel data surrounding a position to be generated.

* * * * *